(12) United States Patent
Kastalsky

(10) Patent No.: US 8,610,104 B2
(45) Date of Patent: Dec. 17, 2013

(54) NANOTUBE ARRAY INJECTION LASERS

(75) Inventor: Alexander Kastalsky, Wayside, NJ (US)

(73) Assignee: Nano-Electronic and Photonic Devices and Circuits, LLC, Bridgeport, PA (US)

( * ) Notice: Subject to any disclaimer, the term of this patent is extended or adjusted under 35 U.S.C. 154(b) by 443 days.

(21) Appl. No.: 12/986,511

(22) Filed: Jan. 7, 2011

(65) Prior Publication Data

US 2011/0188527 A1    Aug. 4, 2011

Related U.S. Application Data

(63) Continuation-in-part of application No. 12/011,044, filed on Jan. 24, 2008, now Pat. No. 8,440,994.

(51) Int. Cl.
*H01L 29/06*    (2006.01)

(52) U.S. Cl.
USPC .. 257/12; 257/24; 257/E21.09; 257/E29.005; 257/E33.005; 372/44.01; 977/742; 977/750

(58) Field of Classification Search
None
See application file for complete search history.

(56) References Cited

U.S. PATENT DOCUMENTS

| | | | |
|---|---|---|---|
| 6,062,931 A | 5/2000 | Chuang et al. | |
| 6,297,063 B1 | 10/2001 | Brown | |
| 6,972,467 B2 | 12/2005 | Zhang | |
| 6,998,634 B2 | 2/2006 | Cheong et al. | |
| 7,102,157 B2 | 9/2006 | Kastalsky | |
| 7,151,209 B2 | 12/2006 | Empedodes | |
| 7,211,143 B2 | 5/2007 | Yang | |
| 7,348,675 B2 | 3/2008 | Dubin et al. | |
| 7,470,620 B2 | 12/2008 | Dubin et al. | |
| 7,474,811 B1 | 1/2009 | Quitoriano et al. | |
| 7,525,653 B1 * | 4/2009 | Hug et al. | 356/317 |
| 7,666,708 B2 | 2/2010 | Lieber et al. | |
| 7,851,784 B2 | 12/2010 | Kastalsky | |
| 8,168,495 B1 | 5/2012 | Lim et al. | |
| 2002/0097770 A1 | 7/2002 | Mekis et al. | |
| 2002/0130311 A1 | 9/2002 | Lieber et al. | |
| 2002/0172820 A1 | 11/2002 | Majumdar et al. | |
| 2003/0089899 A1 * | 5/2003 | Lieber et al. | 257/9 |
| 2003/0122133 A1 | 7/2003 | Choi et al. | |
| 2003/0205966 A1 | 11/2003 | Chen et al. | |
| 2004/0044235 A1 | 3/2004 | Cheron et al. | |
| 2004/0058153 A1 | 3/2004 | Ren et al. | |

(Continued)

OTHER PUBLICATIONS

Boccaccini et al., "Electrophoretic Deposition of Carbon Nanotubes", Carbon, Jun. 12, 2006, 44, 3149-3160.
Bonard et al, Applied Physics Letters, "Field Emission from Carbon Nanotubes: Perspectives for Applications and Clues to the Emission Mechanism", A69, Jul. 29, 1999, 245-254.

(Continued)

*Primary Examiner* — Minh-Loan T Tran
*Assistant Examiner* — Fazli Erdem
(74) *Attorney, Agent, or Firm* — Woodcock Washburn, LLP

(57) ABSTRACT

Carbon nanotube (CNT)-based devices and technology for their fabrication are disclosed. The planar, multiple layer deposition technique and simple methods of change of the nanotube conductivity type during the device processing are utilized to provide a simple and cost effective technology for large scale circuit integration. Such devices as p-n diode, CMOS-like circuit, bipolar transistor, light emitting diode and laser are disclosed, all of them are expected to have superior performance then their semiconductor-based counterparts due to excellent CNT electrical and optical properties. When fabricated on semiconductor wafers, the CNT-based devices can be combined with the conventional semiconductor circuit elements, thus producing hybrid devices and circuits.

10 Claims, 9 Drawing Sheets

(56) References Cited

U.S. PATENT DOCUMENTS

| | | |
|---|---|---|
| 2004/0127012 A1 | 7/2004 | Jin |
| 2004/0213307 A1* | 10/2004 | Lieber et al. .................. 372/39 |
| 2005/0056877 A1 | 3/2005 | Rueckes et al. |
| 2005/0161662 A1 | 7/2005 | Majumdar et al. |
| 2005/0164432 A1 | 7/2005 | Lieber et al. |
| 2005/0167755 A1 | 8/2005 | Dubin et al. |
| 2005/0224888 A1 | 10/2005 | Graham et al. |
| 2005/0230270 A1 | 10/2005 | Ren et al. |
| 2006/0022191 A1 | 2/2006 | Bakkers et al. |
| 2006/0169972 A1 | 8/2006 | Furukawa et al. |
| 2006/0220141 A1 | 10/2006 | Besser |
| 2006/0228074 A1 | 10/2006 | Lipson et al. |
| 2006/0286686 A1 | 12/2006 | Lem et al. |
| 2007/0032051 A1 | 2/2007 | Lieber et al. |
| 2007/0114628 A1 | 5/2007 | Barrios et al. |
| 2007/0164270 A1 | 7/2007 | Majumdar et al. |
| 2007/0272297 A1 | 11/2007 | Krivoshlykov et al. |
| 2008/0157126 A1 | 7/2008 | Bertin et al. |
| 2008/0191189 A1 | 8/2008 | Kastalsky |
| 2008/0218074 A1 | 9/2008 | Kastalsky |
| 2008/0315302 A1 | 12/2008 | Farrow et al. |
| 2009/0317597 A1 | 12/2009 | Kumagai et al. |
| 2011/0297846 A1 | 12/2011 | Wang |

OTHER PUBLICATIONS

Derycke et al., "Carbon Nanotube Inter- and Intramolecular Logic Gates", Nano Letters, Aug. 26, 2001, 1(9), 453-456.

Fuhrer et al. (Kuzmany, Ed.), "Ballistic Transport in Semiconducting Carbon Nanotubes", Electronic properties of molecular nanostructures : XV International Winterschooi/Euroconference, Kirchberg, Tirol, Austria, Mar. 3-10, 2001, CP591, 401-404.

Guo et al., "Carrier Transport and Light-Spot Movement in Carbon-Nanotube Infrared Emitters", Applied Physics Letters, Jan. 3, 2005, 86(023105), 1-3.

Javey et al., "Self-aligned ballistic molecular transistors and electrically parallel nanotube arrays", Nano Letters, 2004, 4(7), 1319-1322.

Kong et al., "Chemical Profiling of Single Nanotubes: Intramolecular p-n-p Junctions and On-Tube Single-Electron Transistors", Applied Physics Letters, 2002, 80(1), 73-75.

Lee, "Carbon Nanotube p-n Junction Diode", Abstract submitted to the Nanotube'04 Conference, Mar. 3, 2004, available at http://materials.ipicyt.edu.mx/-nt04-abstracts/P23.html, downloaded Aug. 5, 2009.

Preuss et al., "Finer Copper Wires for Faster Integrated Circuits", Berkeley Lab Currents, Aug. 1998, 1-3.

Ungersboeck et al., Optimization of single-gate carbon-nanotube field-effect trasistors, IEEE, 2005, 4, 533-538.

* cited by examiner

FIG. 1
a)
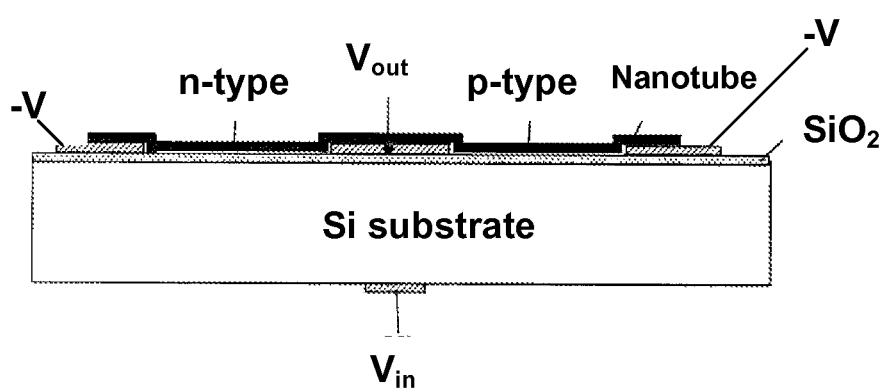
b)
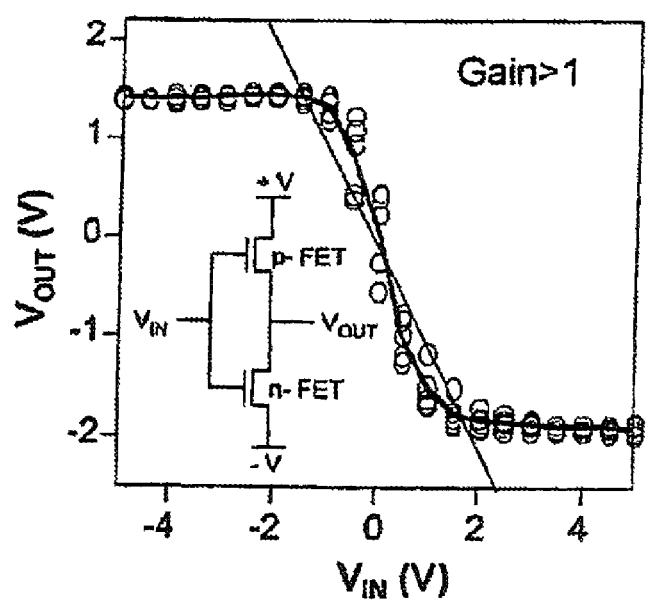

NANOTUBE ARRAY INJECTION LASERS

CROSS REFERENCE TO RELATED APPLICATIONS

This application is a continuation-in-part from, and claims priority to U.S. patent application Ser. No. 12/011,044, filed Jan. 24, 2008, the disclosure of which is incorporated herein by reference in its entirety.

TECHNICAL FIELD

The invention relates to carbon nanotube array of p- and n-channel transistors and p-n diodes and specifically, to complementary circuits of nanotube array field-effect transistors, bipolar transistors, and optoelectronic devices.

BACKGROUND

Nanotubes (NTs), generally, and Carbon Nanotubes (CNTs), specifically, are viewed to be a new key element for future electronics. In the CNT, especially single walled carbon nanotubes (SWCNTs), such unique properties as quantization of the electron spectrum, ballistic electron propagation along the tube, current densities as high as $10^9$ A/cm$^2$, existence of the semiconductor phase, possibilities for n- and p-doping with a high carrier mobilities, as well as excellent thermal conductance, make nanotubes a great candidate for future novel high-speed, high efficiency electronic and photonic devices.

A key element widely used in the electronic logic circuits is CMOS, wherein both switching states consume minimum energy, see. e.g. J. R. Brews in High-speed Semiconductor Devices, J. Wiley & Sons, New York, p. 139, 1990. It is therefore important for future nanotube applications to reproduce such an element using CNT technology. Such attempts have been carried out in many research places worldwide.

FIG. 1a shows as a Prior Art two CNT FETs in series, with n-type and p-type channel field-effect transistors (FET) forming the CMOS circuit, see V. Derycke et al, Nano Letters 1, p. 453, 2001. The CNT CMOS is made from a single nanotube extended between source and drain metal contacts deposited on the Si substrate, while the controlling gate electrodes are made simply by placing the nanotube on top of the SiO$_2$ insulating layer on the n+Si substrate. To convert originally p-type CNT into n-type, one of the transistors has been subjected to annealing in vacuum. The resultant effect of voltage switch is shown in FIG. 1b.

The proof-of-concept design, used in V. Derycke's work, where a single nanotube is placed on the substrate between the contacts, is utilized in essentially all publication on this topic, for both CMOS circuit and individual transistors (see also E. Ungersboeck, et al, IEEE Transactions on nanotechnology, V 4, p. 533, 2005). The drawback of this method is its impracticality for any scale of circuit integration: placement of multiple identical nanotubes to enhance the output current or to form new circuit elements requires a special micromanipulator and thus precludes any possibility of IC mass manufacturing.

The patent application Ser. No. 11/705,577 filed by A. Kastalsky on February 2007, which issued as U.S. Pat. No. 7,851,784 describes several nanotube array devices and method for their fabrication. Shown in FIG. 2 is the nanotube array FET (the direction of the nanotube array is normal to the drawing plane) in which the nanotubes are grown normal to the substrate and the gate electrode 21 is attached to the sidewall of every nanotube 27 in the array through a layer of insulator 24. The key element is the metal layer 21 in the middle of the nanotube length, sandwiched between two insulator layers 22 and 23. During deposition of the first insulator layer 22, a thin layer of insulation material will also be deposited on the nanotube walls, thereby forming a gate insulator layer 24 around each nanotube. It is then followed by deposition of the gate metal layer 21 and the insulator layer 23. After polishing of the insulator layer 23 and exposure of the nanotube tips, the top metal layer 25 (the drain electrode) is deposited to complete the structure.

SUMMARY

The present invention is directed toward nanotube array electronic and opto-electronic devices and methods of making such devices. The various embodiments share common features related to fabrication techniques and some physical features that make it appropriate for these to be considered together.

The present invention discloses a technology based on the controlled growth of a nanotube array on a metal electrode normal to the electrode plane and then sequential deposition of dielectric and metal layers to produce a solid platform for attachment of a second common contact to all the nanotube tips, thereby forming source and drain electrodes. The transistor gate electrode is made as a third conductive layer sandwiched between the dielectric layers and placed somewhere in the middle of the nanotube length.

Several nanotube array devices are disclosed relying on a method of planar multilayer deposition technique combined with the appropriate processing for controllable formation of p- and n-type regions along the nanotube length during the device fabrication.

Simple methods of variation of the carrier type of conductivity along the nanotube, utilized in the disclosed technology, allow simple fabrication of p-n diodes. They are expected to possess an extremely low intrinsic capacitance due to small nanotube diameter and therefore, very high operational frequency. Furthermore, p-n-p or n-p-n structures suitable for manufacturing of bipolar transistors are also within the scope of the disclosed devices.

The electron-hole injection in the forward bias direction may also provide inter-band optical emission due to electron-hole radiative recombination. Below, nanotube array Light Emitting Diodes and Injection Lasers are described, wherein excellent optical properties of CNTs ensure high efficiency of the proposed optoelectronic devices.

One embodiment of this invention is a Complementary Metal Insulator Nanotube circuit comprising (a) a dielectric substrate onto which a first and a second spatially separated metal layers are superposed; (b) a first array of p-type vertical nanotubes positioned substantially perpendicularly to and in electrical communication with said first spatially separated metal layer, said array comprising at least one p-type nanotube; (c) a second array of n-type vertical nanotubes positioned substantially perpendicularly to and in electrical communication with said second spatially separated metal layer, said array comprising at least one n-type nanotube; (d) a first dielectric layer covering said first and second metal layers, having a thickness of about half the length of said vertical nanotubes of the first and second arrays so as to embed the lower half of the first and second arrays, and said first dielectric layer also providing a coating on the sidewalls of at least part of the upper remaining half of the vertical nanotubes of the first and second arrays of sufficient thickness and length as to act as a gate insulator to a third metal layer; (e) the third metal layer covering said first dielectric layer and reaching said first dielectric layer on said sidewalls of the nanotubes in both sets of vertical nanotube arrays, so as to be capable of acting as a gate electrode to the device; (f) a second dielectric layer deposited on top of said third metal layer and making the total thickness of all deposited metal and dielectric layers substantially the same length of the lengths of the first and second nanotube arrays; and (g) a fourth metal layer deposited on the second dielectric layer and in electrical communication with both first and second arrays of vertical nanotubes, so that said fourth metal layer connects both sets of said nanotube arrays and thus makes a circuit of two transistors in series.

Another embodiment provides a method of making a Complementary Metal Insulator Nanotube circuit comprising: (a) depositing first and second spatially separated metal layers upon a dielectric substrate; (b) growing a first vertical nanotube array on the first metal layer and a second vertical nanotube array on the second spatially separated metal layer, each nanotube array having the same conductivity type, and each vertical nanotube array having at least one vertical nanotube; (c) converting one of the nanotube arrays into the opposite conductivity type, to give rise to a p-type nanotube array and an n-type nanotube array; (d) providing a first dielectric layer covering said first and second metal layers, a half length of the nanotubes and partially sidewalls of the nanotubes; (e) providing a third metal layer covering said first dielectric layer and reaching said first dielectric layer on said sidewalls of the nanotubes in both said nanotube arrays; (f) providing a second dielectric layer deposited on top of said third metal layer and making the total thickness of all deposited metal and dielectric layers smaller than the nanotube length, to give rise to nanotube ends protruding above said second dielectric layer; (g) removing the protruding nanotube ends; and (h) providing a fourth metal layer covering said first and second vertical nanotube arrays, the fourth metal layer being deposited on the second dielectric layer, the fourth metal layer electrically connecting the first and second vertical nanotube arrays to give rise to a circuit of two transistors in series; wherein said third metal layer is capable of functioning as a gate electrode of the two transistors in the circuit, and said first dielectric layer deposited on said sidewalls of the nanotubes is capable of functioning as a gate insulator of the two transistors in the circuit.

Still another embodiments provide methods of forming a catalytic pad of reduced dimensions comprising, (a) depositing a layer of an organic polymer on a substrate; (b) patterning an opening having an effective diameter of $d_1$ in the organic material, so as to expose the substrate; (c) heating the organic layer above its melt temperature such that it flows to reduce the size of the opening to an effective diameter $d_2$; and (d) depositing a catalytic metal inside the opening to an effective diameter $d_2$ to produce a pad of catalytic metal having an approximate effective diameter $d_2$. Further embodiments provide substrates for growing at least one single walled carbon nanotube made by these methods, as well as the arrays of at least one vertical carbon nanotube or single-walled carbon nanotubes made by these methods.

Other embodiments provide for Nanotube Array Bipolar Transistors and methods for making the same. One such embodiment comprises: (a) a first metal layer, optionally superposed on a substrate; (b) at least one array of at least one nanotube superposed on, positioned normal to the plane of, and in electrical communication with the first metal layer, wherein the at least one nanotube comprises sequential first, second, and third sections exhibiting a first, second, and first semiconductor-type conductivity, respectively; (c) a first dielectric layer superposed on the first metal layer having a thickness corresponding to the length of the first section of the at least one nanotube exhibiting the first semiconductor-type conductivity; (d) an optional second dielectric layer superposed on the first dielectric layer; (e) a second metal layer superposed on the optional second dielectric layer (in either case, superposed on the first dielectric layer); (f) an optional third dielectric layer superposed on the second metal layer, such that the combined thickness of the optional second dielectric, second metal, and optional third dielectric layers corresponds to the length of the second section of the at least one nanotube exhibiting the second semiconductor-type conductivity, and such that the second metal layer is in electrical communication with the section of the at least one nanotube exhibiting the second semiconductor-type conductivity; (g) a fourth dielectric layer superposed on the optional third dielectric layer (in either case, superposed on the second metal layer) having a thickness corresponding to the length of the third section of the at least one nanotube exhibiting the first semiconductor-type conductivity; and (h) a third metal layer, superposed on the fourth dielectric layer, in electrical communication with the at least one nanotube.

Still other embodiments provide for Nanotube Array Light Emitting Diodes and method of making the same, wherein one such embodiment comprises: (a) a first electrically conductive layer capable of reflection at least 70% of incident light; (b) at least one array of a plurality of nanotubes superposed on, positioned normal to the plane of, and in electrical communication with the first electrically conductive layer, wherein each nanotube of the plurality of nanotubes comprises sequential first and second sections exhibiting opposite first and second semiconductor-type conductivity, respectively, so as to comprise a p-n or n-p semiconductor junction; (c) a first optically transparent or semi-transparent dielectric layer superposed on the first electrically conductive layer, having a thickness corresponding to the length of the section of each nanotube exhibiting the first semiconductor-type conductivity; (d) a second optically transparent or semi-transparent dielectric layer superposed on the first optically transparent or semi-transparent, dielectric layer having a thickness corresponding to the length of the section each nanotube exhibiting the second semiconductor-type conductivity; (e) and a second electrically conductive layer superposed on the second dielectric layer and in electrical communication with the at least one array of nanotubes.

Additional embodiments provide for Nanotube Array Injection Lasers and methods for making the same, one such embodiment comprising (a) a first electrically conductive layer; (b) at least one array of a plurality of nanotubes superposed on, positioned normal to the plane of, and in electrical communication with the first electrically conductive layer, wherein each nanotube of the plurality of nanotubes comprises sequential first and second sections exhibiting opposite first and second semiconductor-type conductivity, respectively, so as to comprise a p-n or n-p semiconductor junction; (c) a first dielectric layer having a first refractive index superposed on the first electrically conductive layer; (d) a second dielectric layer having a second refractive index superposed on the first dielectric layer, such that the combined thickness of the first and second dielectric layers is about the same as the length of the first section of each nanotube, and wherein the second refractive index is greater than the first refractive index; (e) a third dielectric layer superposed on the second dielectric layer, and having the same thickness and being compositionally equivalent to the second dielectric layer; (f) a fourth dielectric layer superposed on the third dielectric layer, and having the same thickness and being compositionally equivalent to the first dielectric layer, such that the combined thickness of the third and fourth dielectric layers is about the same as the length of the second section of each nanotube, wherein the combined first and fourth dielectric layers define the first cladding of a laser waveguide and the combined second and third dielectric layers define the core of the laser waveguide; (g) a second electrically conductive layer superposed on the fourth dielectric layer and in electrical communication with the at least one array of nanotubes; and (h) two side mirrors positioned opposite to one another, normal to the planes of the first and second conductive layers, and parallel to the at least one nanotube array such that the at least one nanotube array is positioned between the two side mirrors, and configured to create a Fabri-Perot resonator for the laser action.

In every case, the devices require nanotubes having semiconductor-type features. Such nanotubes may comprise metalloids or carbon. In those embodiments where the nanotubes are carbon nanotubes, they comprise or consist of single-walled carbon nanotubes.

Additional embodiments include methods of making the described devices and those devices or articles of commerce which incorporate or take advantage of the features of the described devices.

BRIEF DESCRIPTION OF THE FIGURES

While the following Figures are illustrative of various embodiments of the devices and device types described herein, they should not be construed as limiting these embodiments. Similarly, while convenient to visualize or even refer to the embodied structures as having a top, bottom, and sides, these terms should not be seen as limiting the possible orientation of the devices. Further, if or when the terms "top," "bottom," or "side" are used with respect to a layer or surface, these terms are so presented merely to help the reader visualize the device or process, and should not be deemed to limit the device in any way. Similarly, use of the term "vertical" is intended to connote an orientation orthogonal or normal to the plane of a base substrate or electrically conductive layer.

FIG. 1. Overhead view of structure showing two carbon nanotube field effect transistors in series and the resultant effect of the voltage switch.

DETAILED DESCRIPTION OF ILLUSTRATIVE EMBODIMENTS

Figure 2:
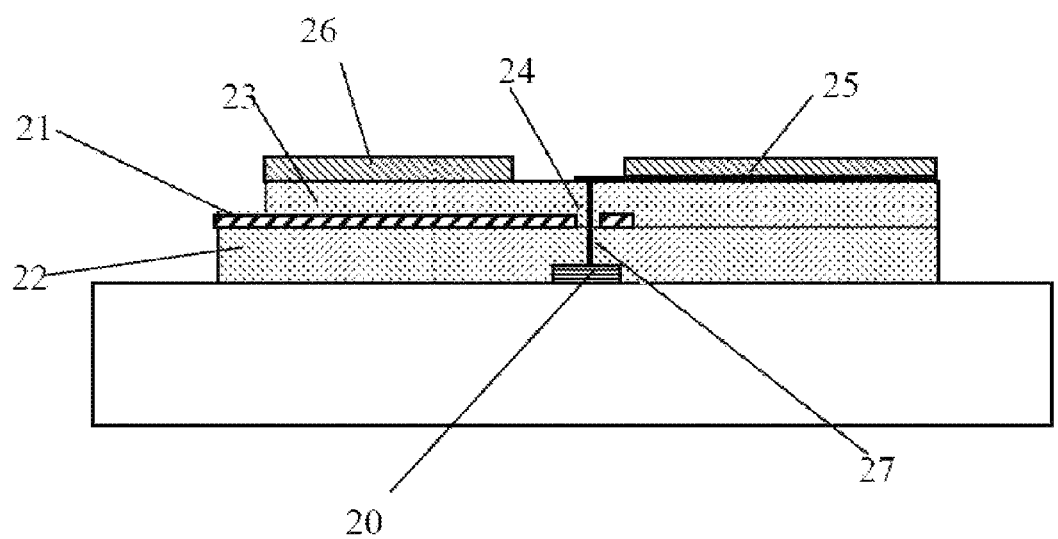
FIG. 2. Cross-sectional view of a nanotube array FET.

The present invention may be understood more readily by reference to the following detailed description taken in connection with the accompanying Figures, which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to the devices and methods of making and/or using these devices, and articles incorporating these devices.

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When values are expressed as approximations by use of the antecedent "about," it will be understood that the particular value forms another embodiment. In general, use of the term "about" indicates approximations that can vary depending on the desired properties sought to be obtained by the disclosed subject matter and is to be interpreted in the specific context in which it is used, based on its function, and the person skilled in the art will be able to interpret it as such. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, reference to values stated in ranges includes each and every value within that range.

It is to be appreciated that certain features of the invention which are, for clarity, described herein in the context of separate embodiments, may also be provided in combination in a single embodiment. Conversely, various features of the invention that, for brevity are described in the context of a single embodiment, may also be provided separately or in any subcombination. Finally, while an embodiment may be described as part of a series of steps or part of a more general composition or structure, each said embodiment may also be considered an independent embodiment in itself.

The described objects of the invention essentially cover the majority of modern semiconductor electronic and optoelectronic devices: p-n diodes, transistors, CMOC switches, bipolar transistors, as well as light emitting diodes and lasers. Because of the outstanding electrical and optical properties of semi-conducting nanotubes, especially SWCNTs, all these devices are expected to have parameters superior to their semiconductor counterparts.

According to the present invention, related fabrication techniques are used to manufacture a series of nanotube array electronic and optoelectronic devices. These devices and the specifics of their manufacture are described further below.

As used herein, the term "nanotube" refers to nanotubes exhibiting or capable of exhibiting semiconductor-type conductivity, and so may comprise one or more metalloid (e.g., Si, GaAs, or InP), certain metal oxides (e.g., comprising ZnO, SnO, InO, or mixtures thereof) or carbon. More specifically, this includes single-walled carbon nanotubes (SWCNTs). Suitable nanotube electronic devices of the present invention typically use semiconductor type nanotubes, such as semiconducting Single Walled Carbon NanoTubes (SWCNT). Semiconducting SWCNTs can be incorporated into all of the devices described herein, including transistors or CMIN circuitry.

Various embodiments of the fabrication technology described herein include the conversion one semiconductor-type of conductivity to the opposite semiconductor-type conductivity, or more specifically from p-type to n-type or from n-type to p-type. By masking sections of p-type or n-type nanotubes, and subjecting the exposed portions of the nanotubes to the appropriate conditions, it is possible to convert only that section of the nanotube to the opposite type conductivity, thereby creating semiconductor junctions within a given nanotube. Typically, the layers of dielectric material are used as the masking layers, they abut and are in physical contact with the walls of the nanotubes to protect the otherwise encased nanotubes from the subsequent conversion environment. In the case of metalloid or inorganic nanotubes, this may be achieved by chemical doping or exposure to oxidative or reductive atmospheres. In the case of carbon, the conversion of p-type carbon nanotubes (including SWCNTs), or sections of nanotubes, into n-type can be accomplished by annealing of originally p-type carbon nanotubes (including SWCNTs), or exposed sections thereof, in a vacuum (or other reducing or non-oxidative atmosphere). Another option for p-type to n-conversion is annealing of the carbon nanotubes (including SWCNTs), or exposed sections thereof, in a potassium atmosphere. Similar conversions of n-type to p-type are also possible, generally by annealing n-type carbon nanotubes (including SWCNTs), or exposed sections thereof, in an oxidizing atmosphere, e.g., oxygen, so as to convert the n-type nanotube to p-type.

Where conversion of one semiconductor-type of conductivity to the opposite semiconductor-type conductivity follows the deposition of a dielectric or metal layer, it is generally good practice to remove incidental dielectric or metal from the sidewalls of the otherwise exposed nanotubes, to ensure proper conversion. In such cases, the use of techniques such as reactive ion- or wet-etching may be employed.

It should also be appreciated that, while several of the device and methods are described as having or providing a changed conductivity in "the middle of" or "mid-way" or "halfway" along the nanotube length, the invention is not necessarily limited to such a precise definition of "middle," "mid-way," or "halfway." In each case, and unless specifically indicated, these terms may be defined as having the junction or junctions positioned or positioning the junction or junctions (i.e., p-n, n-p, p-n-p, or n-p-n) anywhere along the length of the nanotube(s) between the electrodes, including those positions where the junction or junctions are along 1%, 5%, 10%, 15%, 20%, 25%, 30%, 35%, 40%, 45%, 50%, 55%, 60%, 65%, 70%, 75%, 80%, 85%, 90%, 95%, and 99% of the length of the nanotube, when measured from either end of the nanotube, described herein as the linear distance from a given end, each linear distance representing individual embodiments of the invention.

Additionally, in various embodiments of any of the devices herein, the junctions of each nanotube within an array may be positioned at approximately the same linear distance from a given end of the nanotube as the other nanotubes in the same array; in other embodiments, this distance differs for each nanotube within each array.

Further, where more than one nanotube is present in an array having such a changed conductivity, the conductivity is deemed to be changed if at least about 50%, at least about 60%, at least about 70%, at least about 80%, at least about 90%, at least about 95%, or at least about 99% of nanotubes in the array exhibit the described conductivity change, each range representing individual embodiments of the invention. This measure is usefully applied to all of the devices described within this specification.

In series of embodiments, the devices comprise circuits of two nanotube arrays of transistors with different types of conductivity connected in series to form a logic element Complementary Metal Insulator Nanotube (CMIN) device, similar to the Si-based Complementary Metal Oxide Semiconductor (CMOS) circuitry. As in conventional CMOS, one of the transistor arrays has nanotubes with electron conductivity, while the second transistor array has nanotubes with hole conductivity.

These CMIN embodiments contain at least two vertical nanotube arrays of different types of conductivity, each having a transistor structure such as shown in FIG. 2. The transistor arrays are connected in series through the top electrode, while the metal layer in the middle of the structure represents a common gate electrode for both arrays. This method of growth of CNT arrays in predetermined position and planar deposition of multi-layer structure, with the nanotubes being buried inside the structure, provides the device processing suitable for the large scale integration of CNT-based integrated circuits.

Similar planar multilayer deposition technique and arrangements apply to a new nanotube array bipolar transistor (NABT) of vertical p-n-p and n-p-n device configurations, the change in the type of conductivity in the middle of the nanotube (transistor base) being produced using the methods of annealing in vacuum or in appropriate gas atmosphere described above. The contact to the base is made using the same method of deposition of the metal layer sandwiched between two dielectrics, similar to the gate in the CMIN. Unlike the insulated gate of the CMIN, however, the metal in the NABT is directly attached to the nanotube sidewall to provide the base contact with a low contact resistance. To minimize the contact resistance, palladium as a contact metal is preferable, see A. Javey et al, Nano Letters, V. 4. p. 1319, 2004. The disclosed nanotube array bipolar transistor is expected to possess unique speed of operation due to both ballistic carrier travel across the base and extremely low intrinsic device capacitances.

The arrangement of vertical nanotube array of p-n junctions also provide for new types of optical elements. The electron-hole injection will result in a radiative recombination, and the device is expected to function as a nanotube array light emitting diode (NALED) and/or a nanotube array injection laser (NAIL).

The terms used within this application are generally given their normal interpretation so as to be understood by one skilled in the art of semiconductor devices or fabrication or in the art areas of the devices themselves. Certain specific terms are defined herein for sake of added clarity. For example, the vertical positioning of the nanotubes, relative to the plane of the base substrate or electrodes, is one of the novel features of the present devices. As used herein, the term "vertical" is intended to connote an orientation relative to the plane of the base of the device, that relative orientation being substantially orthogonal or normal to that plane.

Unless otherwise specified, the term "substrate" refers to a material capable of providing physical support for the described device. A substrate may be insulative, conductive, or semiconductive, as appropriate for the device being considered. A suitable substrate will comprise materials and have characteristics suitable for any purpose required of the device to which it is attached, including but limited to ability to withstand the downstream processing temperatures needed for the fabrication of the device as well as the surface finish, electrical, thermal, and optical transparency, reflectivity, or opacity suitable or traditionally employed to allow proper operation of the device. Silicon wafers, glasses, or ceramics are exemplary inorganic substrates.

Unless otherwise specified, the terms "dielectric" or "dielectric layer" refer to materials providing an electrically insulative function, and comprise those materials traditionally used in semiconductor processing or devices for this purpose. As with substrates, a suitable dielectric will comprise materials and have characteristics suitable for any purpose required of the device to which it is attached, including but limited to ability to withstand the processing temperatures or chemical treatments associated with the downstream fabrication steps of the device as well as the surface finish, electrical, thermal, and optical transparency, reflectivity, or opacity suitable or traditionally employed to allow proper operation of the device. Exemplary materials may include glasses or ceramics comprising oxides, nitrides, or carbides of silicon, titanium, organic polymers, or mixtures thereof. Such dielectrics may be applied using standard semiconductor processing, for example including, as appropriate, chemical or physical vapor deposition or spin coating.

As used herein, the terms "metal" or "metal layer" refer to those traditionally used in semi-conductor processing, and include aluminum, chromium, cobalt, gold, nickel, silver, palladium, and platinum. However the terms may also include other electrically conductive materials, provided these comprise other electrically conductive materials are capable of surviving the processing conditions suggested by the descriptions, and provide the performance consistent with metal layer materials. For example, the choice of a "metal" or "metal layer" deposited after one or more temperature intensive steps may be more flexible than one which must survive such a temperature intensive step (e.g., temperatures used in depositing carbon nanotubes). In such cases, organic polymer or grapheme "metals" may offer an alternative option to traditionally considered metals. Such metal layers may be applied using standard semiconductor processing, for example including, as appropriate, chemical or physical vapor deposition or spin coating.

Vertical SWCNTs represent especially attractive components of the devices described herein, but are more difficult to grow. Because their diameter is in the range of 1-2 nm, they typically require extremely small pads of catalytic material, in the range of a few nanometers.

Figure 5:
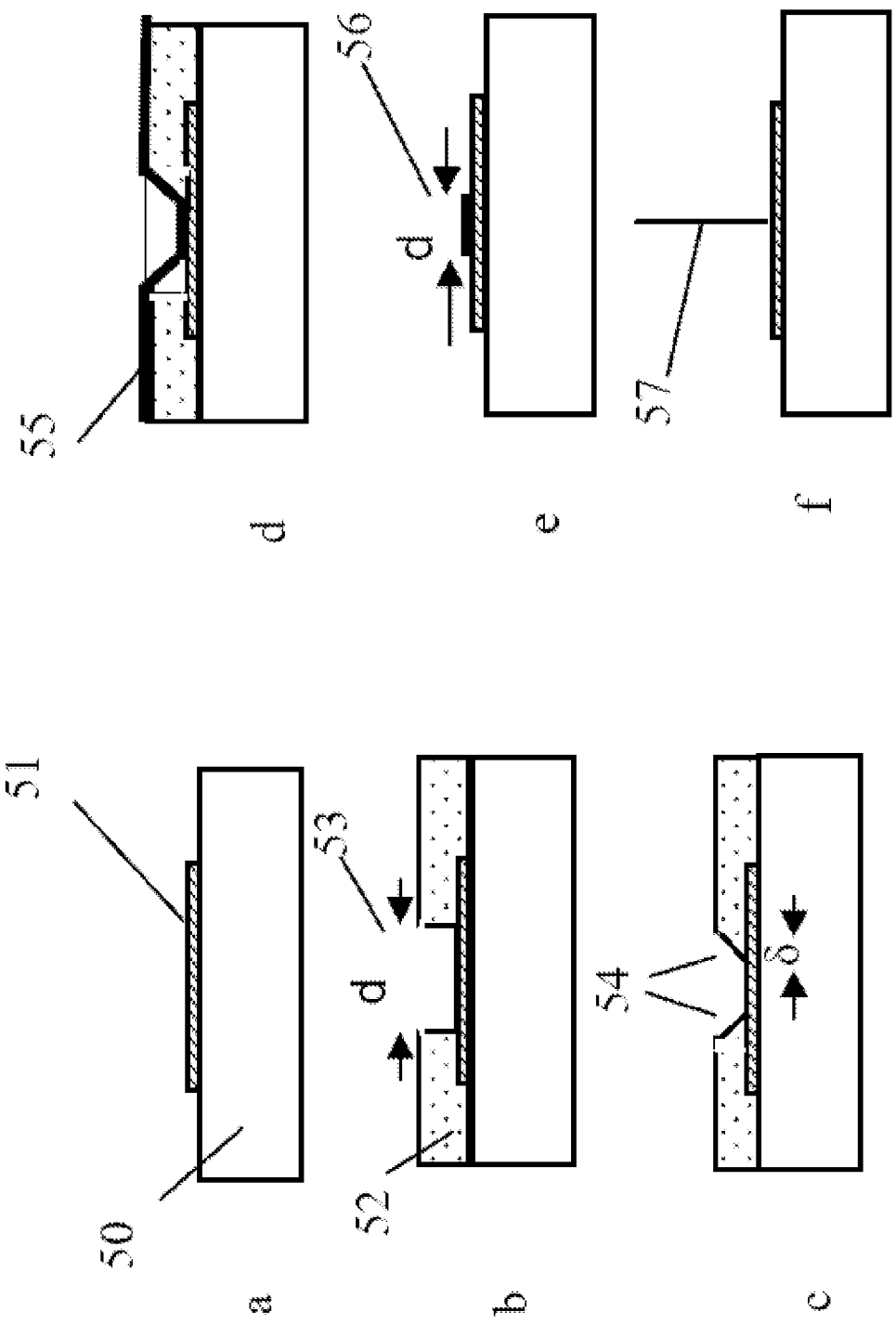
FIG. 5. One exemplary schematic of the processing steps for fabrication of nanopads for catalyzing growth of SWCNTs.

FIG. 5 shows one embodiment of a new method of the present invention, for providing catalytic pads of reduced dimensions, including catalytic "nanopads." In one embodiment, a method of forming a catalytic pad of reduced dimensions comprises (a) depositing a layer of an organic polymer on an optionally metallized substrate; (b) patterning an opening in the organic layer having an effective diameter of $d_1$, so as to expose the substrate; (c) heating the organic layer above its melt temperature such that it flows to reduce the size of the opening to an effective diameter $d_2$; and (d) depositing a catalytic metal inside the opening to an effective diameter $d_2$ to produce a pad of catalytic metal having an approximate effective diameter $d_2$.

In this context, the terms "effective diameters" of $d_1$ and $d_2$ connote a shape of the opening consistent with that of a circle, these openings are not necessarily constrained to this shape. Accordingly, the term "effective diameter" is intended to reflect an opening size consistent with that of a corresponding circle. This may be calculated by taking the arithmetic average of the diameters of the opening; for example, in the case of an oblong opening, the average of the major and minor axes. Another way of calculating this effective diameter is to determine the area of the opening, A (e.g., in the case of a square), and apply the formula:

$$\text{Effective diameter} = 2 \times \text{square root}(A/\pi)$$

In separate embodiments of this method, $d_1$ is in the range of between about 5 and about 250 nm, in the range of between about 10 and about 50 nm, in the range of between about 10 and about 30 nm, and in the range of between about 15 and about 20 nm.

In other separate embodiments, $d_2$ is in the range of between about 1 and about 25 nm, in the range of between about 1 and about 10 nm, and in the range of between about 1 and about 5 nm. Larger dimensioned openings are also available by the methods described herein, but are less attractive in semiconductor devices.

In certain embodiments, the substrate 50 comprises an insulating or semi-conductive surface of appropriate surface finish for the intended purpose (for example, polished and/or single crystal Si, GaAs, InP, ceramic, or glass). At least one metal electrode 51 may be applied using conventional semiconductor techniques, FIG. 5a. The method also provides that the portion of the optionally metallized surface to be patterned is covered with an organic material, for example a thermoplastic or a material which is capable of viscous flow on heating. A particularly useful organic material for the present invention comprises polymethyl methacrylate, PMMA.

In some embodiments, the methods provide that the organic polymer is a resist or photoresist and the patterning is achieved by lithographic methods—for example, patterning by e-beam lithography—and subsequent heat treatment of the patterned photoresist to produce nanopads to the desired dimensions of a few nm necessary for making SWCNT-based CMIN. Where the resist or photoresist is an e-beam resist, such resists are commercially available and the range of available materials. Those embodiments comprising E-beam lithography, which is the highest resolution patterning technology, are especially attractive for producing the smallest diameter openings, though the principle of the invention applies to other photoresist patterning technologies as well. For example, openings can also be created using nanoimprint lithography, interference lithography, self-assembled copolymer pattern transfer, spin coating, electron beam lithography, focused ion beam milling, photolithography, reactive ion-etching, wet-etching, plasma-enhanced chemical vapor deposition, electron beam evaporation, sputter deposition, and combinations thereof. However, using e-beam photoresist and pattering, it is possible to achieve opening 53 of the minimum size of $d_1$ 15-20 nm, FIG. 5b.

Once formed, the opening 53 is further reduced by a controlled melting of the resist or photoresist 52 by subjecting it to a temperature treatment sufficient to allow the polymer to flow. For example, it is known that PMMA photoresist materials begin to flow as viscous liquids as the temperature is raised above T~90° C. This results in a partial covering 54 of the opening 53 with the melted photoresist, FIG. 5c. The length of photoresist extension δ depends on many factors, such as type of photoresist, temperature, duration of heating and photoresist thickness. All these parameters must be considered and tightly controlled and adjusted to obtain desirable photoresist extension δ.

While the diameter of the opening may be defined in terms of $d_1$, $d_2$, and δ, in certain situations, the flow of the organic layer may also result in extremely thin layers or even monolayers of polymer on the surface of the substrate. Such thin or monolayer polymer coatings may be removed by conventional chemical or physical etching methods to improve the reliability or performance of the resulting device.

A thin film of catalytic material 55 is then deposited on the substrate 50, as shown in FIG. 5d, using standard physical or chemical, including vapor, deposition techniques. The term "catalytic material" in this context refers to those materials known to catalyze the growth of nanotubes, especially carbon nanotubes. Exemplary metals include, but are not limited to those described above; especially Co, Ni or Fe.

After photoresist lift-off, one obtains the pad of catalytic material 56 of dimension $d_2=d_1-2\delta$, as shown in FIG. 5e. Where the pads 16 are of sufficiently small dimensions (e.g., 1-10 nm), they can be used as templates to grow SWNTs, including SWCNTs (FIG. 5f).

The deposited catalytic pad 56 may also be subjected to higher temperatures to coalesce the catalytic materials into an effective sphere having an effective radius R calculated to be:

$$(4/3)\pi R^3 = \pi/4(d_2)^2 \cdot t$$

where t is the thickness of the catalytic material 55. For the initial diameter of $d_1=15$ nm and $\delta=5$ nm, one obtains $d_2\_5$ nm and with t~1 nm the sphere radius R~1.7 nm. This is sufficiently small to grow SWCNTs. Useful effective radii for use in this capacity are in the ranges having lower boundaries of about 0.5 nm, about 1.0 nm, about 1.5 nm, about 2.0 nm, and about 2.5 nm and upper boundaries of about 2 nm, about 3 nm, about 4 nm, about 5 nm, and about 6 nm; for example, in the range from about 0.5 nm to about 3.0 nm, from about 0.5 nm to about 2.5 nm, from about 0.5 to about 2.0 nm, and from about 1.0 nm to about 2.0 nm.

Catalytic pads produced by any of the preceding methods can be used to produce templates for the growth of vertical nanotubes, including carbon nanotubes, and further including the growth of SWCNTs when the pads are sufficiently small (i.e., "nanopads"). Such templates can be used to grow single or multiple arrays of at least one nanotubes, including SWCNTs. These methods and devices derived therefrom can be used to prepare a range of devices, some of which are described herein. For example, to produce CMIN circuit, two electrically separated metal electrodes 57 are utilized to form two SWCNT-based transistors of the CMIN (not shown) using the same method of the photoresist melting.

1. Design and Fabrication of Complementary Metal Insulator Nanotube (CMIN) Devices Various embodiments provide for Complementary Metal Insulator Nanotube devices and methods of making the same. In one such embodiment, a Complementary Metal Insulator Nanotube device comprises (a) a dielectric substrate onto which a first and a second spatially separated metal layers are superposed; (b) a first array of p-type vertical nanotubes positioned substantially perpendicularly to and in electrical communication with said first spatially separated metal layer, said array comprising at least one p-type nanotube; (c) a second array of n-type vertical nanotubes positioned substantially perpendicularly to and in electrical communication with said second spatially separated metal layer, said array comprising at least one n-type nanotube; (d) a first dielectric layer covering said first and second metal layers, having a thickness of about half the length of said vertical nanotubes of the first and second arrays so as to embed the lower half of the first and second arrays, and said first dielectric layer also providing a coating on the sidewalls of at least part of the upper remaining half of the vertical nanotubes of the first and second arrays of sufficient thickness and length as to act as a gate insulator to a third metal layer; (e) the third metal layer covering said first dielectric layer and reaching said first dielectric layer on said sidewalls of the nanotubes in both sets of vertical nanotube arrays, so as to be capable of acting as a gate electrode to the device; (f) a second dielectric layer deposited on top of said third metal layer and making the total thickness of all deposited metal and dielectric layers the same length of the lengths of the first and second nanotube arrays; and (g) a fourth metal layer deposited on the second dielectric layer and in electrical communication with both first and second arrays of vertical nanotubes, so that said fourth metal layer connects both sets of said nanotube arrays and thus makes a circuit of two transistors in series.

Another embodiment provides a method of making a Complementary Metal Insulator Nanotube circuit comprising: (a) depositing first and second spatially separated metal layers upon a dielectric substrate; (b) growing a first vertical nanotube array on the first metal layer and a second vertical nanotube array on the second spatially separated metal layer, each nanotube array having the same conductivity type, and each vertical nanotube array having at least one vertical nanotube; (c) converting one of the nanotube arrays into the opposite conductivity type, to give rise to a p-type nanotube array and an n-type nanotube array; (d) providing a first dielectric layer covering said first and second metal layers, a half length of the nanotubes and partially sidewalls of the nanotubes; (e) providing a third metal layer covering said first dielectric layer and reaching said first dielectric layer on said sidewalls of the nanotubes in both said nanotube arrays; (f) providing a second dielectric layer deposited on top of said third metal layer and making the total thickness of all deposited metal and dielectric layers smaller than the nanotube length, to give rise to nanotube ends protruding above said second dielectric layer; (g) removing the protruding nanotube ends; and (h) providing a fourth metal layer covering said first and second vertical nanotube arrays, the fourth metal layer being deposited on the second dielectric layer, the fourth metal layer electrically connecting the first and second vertical nanotube arrays to give rise to a circuit of two transistors in series; wherein said third metal layer is capable of functioning as a gate electrode of the two transistors in the circuit, and said first dielectric layer deposited on said sidewalls of the nanotubes is capable of functioning as a gate insulator of the two transistors in the circuit.

Figure 3:
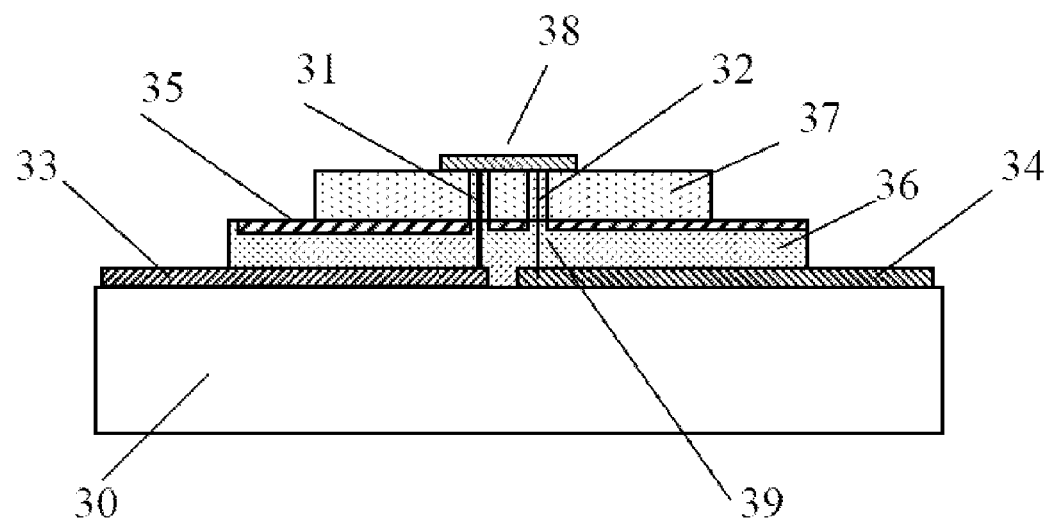
FIG. 3. Cross-sectional view of one embodiment of a CMIN structure.

In another embodiment of the CMIN design, shown with respect to FIG. 3a, two arrays of the nanotubes 31 and 32 are grown on two separate metal electrodes 33 and 34 normal to the substrate 30, which can be glass plate or Si wafer or any other dielectric substrate capable of sustaining nanotube growth temperatures (~600° C.). The nanotube arrays have different types of conductivity, which are produced using above discussed methods of the type conversion. For purposes of discussion herein, nanotubes 31 are described as being p-type and nanotubes 32 are described as n-type, although reverse type assignment is equally applicable, since the CMIN structure is symmetrical. The metal layer 35 sandwiched between two dielectric layers 36 and 37 represents a common gate for two transistors, wherein the first transistors comprises the substrate metal 33 as a source, the nanotube array 31 as a conducting p-channel and the top metal layer 38 as a drain, while the same top metal layer 38 is a source of the second transistor, the nanotube array 32 is an n-channel and substrate metal 34 is a drain. The dielectric layer 39 provides the electrical insulation of the gate metal 35 to both transistor channels.

If the p-channel (array 31) is originally conducting and n-channel (array 32) is depleted, a positive voltage to the gate metal 35 will make n-channel conducting and p-channel depleted, so that the output voltage taken from the connecting metal electrode 38 will be switched from minimum to maximum amplitude if positive voltage Vdd is applied to the drain electrode 34 of the n-channel transistor relative to the source electrode 33 of the p-channel transistor. On the other hand, change of the polarity of Vdd will result in switching the output voltage from its maximum to minimum amplitude at the same positive gate voltage.

A single nanotube from each array 31 and 32 can form two nanotube CMIN circuit. Due to sustainable current density in the SWCNT of $10^9$ cm$^{-2}$, the two nanotube CMIN can provide the current switch of 10 µA. With a realistic nanotube spacing in the array of 1 µm, a 100 µm-long and nanotube diameter wide array will provide 1 mA output current switch, sufficient for IC operations.

Figure 4:
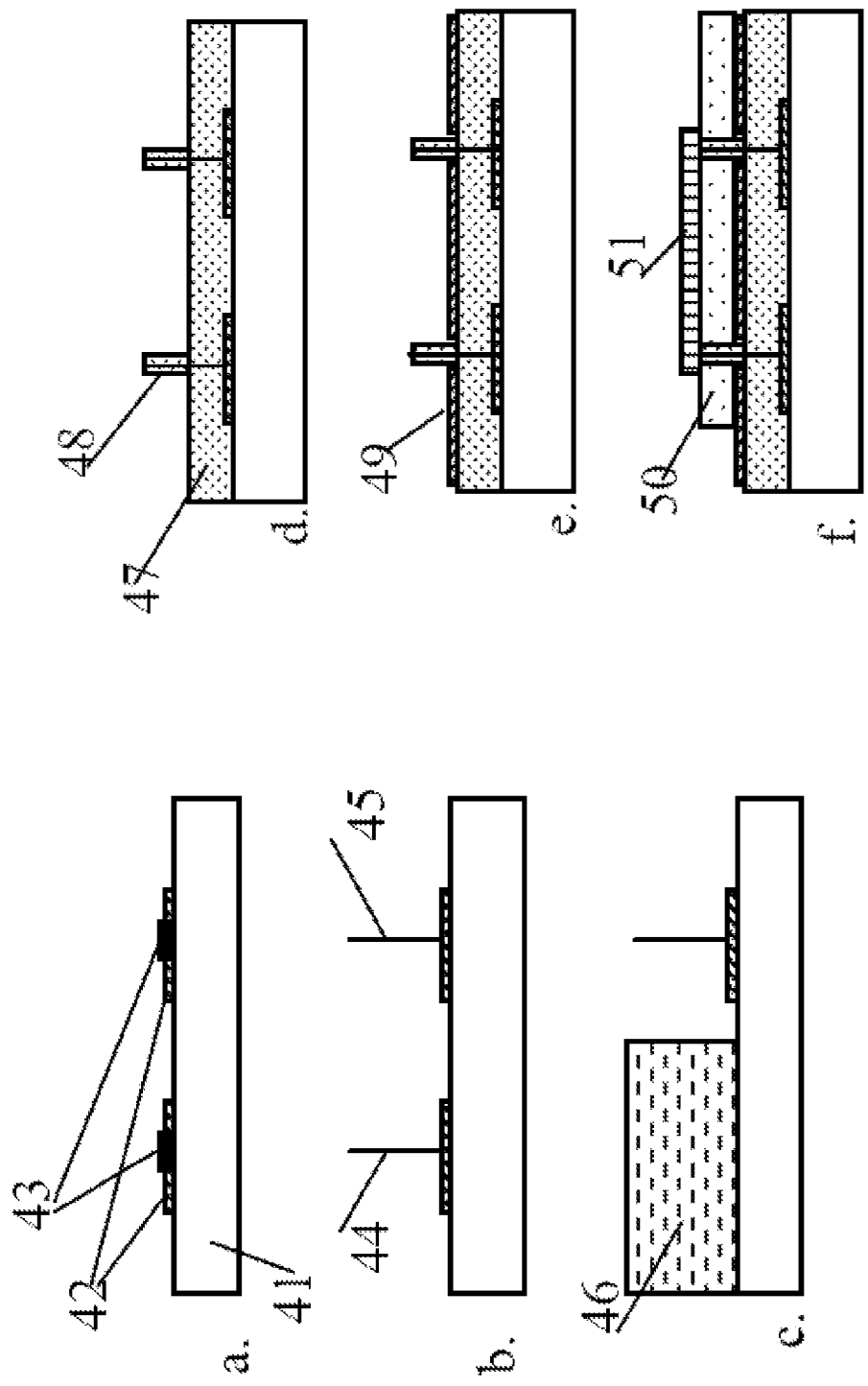
FIG. 4. One exemplary schematic of the processing steps for CMIN fabrication.

FIG. 4 illustrates one embodiment of the processing steps for a CMIN fabrication. It begins from deposition on the substrate 41 of two arrays of metal pads 42 to form first source and drain contacts in predetermined positions, FIG. 4a. For this purpose, palladium is preferable since it provides the lowest contact resistance. It is followed by a placement on the contacts 42 of small pads 43 of catalytic material, such as Co, Ni or Fe, needed for the nanotube growth. After growth of the nanotube arrays 44 and 45, see FIG. 4b, which are normally have p-type conductance, one of the arrays, 44, is protected by deposition of the sacrificial dielectric layer 46, see FIG. 4c, while another nanotube array 45 remains exposed and is annealed in vacuum or in potassium atmosphere to convert it into n-type. Then the sacrificial layer 46 is removed, and two arrays 44 and 45 of respective p- and n-types are ready for further processing. FIG. 4d shows the dielectric layer 47 which is deposited on the substrate and covers the metal electrodes with the nanotubes. At the same time, a thin dielectric layer 48 also coats the side walls of the nanotubes. The metal layer 49 deposited atop of the dielectric 47 represents the common gate electrode for both arrays, see FIG. 4e, while the layer 48 of FIG. 4d is the gate insulator. Then the second dielectric layer 50 covers the nanotube arrays, see FIG. 4f. This layer provides a platform for placement of the top contacts to the transistors. It is preferable to make the layer 50 thin enough to have the nanotube ends slightly protruded above this layer. After polishing, to remove the nanotube ends, the final metal layer 51 is deposited on the exposed nanotube ends to connect the arrays into the circuit of two transistor arrays and form the other two source and drain contacts for transistor circuit. Again, the Pd layer is preferable. Thus, according to the present invention, the planar technology of sequential deposition of dielectric and metal layers allows fabrication of the CMIN circuitry.

A fundamental advantage of the CMIN devices, beyond simplicity of its fabrication, is absence of any physical limits for performance improvement. In the Si world, quantum mechanical laws preclude the current rate of reduction in transistor feature size (gate length), and in order to continue improvements in device speed and cost per chip at present pace it is necessary to develop new switching circuits wherein these limitations are not at work. In the CMIN design, with gate plane intersecting the nanotube cylinder, these limitations are not applicable. The gate length in this case is controlled essentially by the gate metal thickness and can be made very thin without complication in the device processing. On the other hand the gate insulator coating the nanotube sidewalls can also be made very thin. Finally, the carriers in the short nanotube transistor channel will move ballistically, i.e. with a velocity significantly exceeding the saturated carrier velocity in the Si channel of ~$10^7$ cm/s. This implies that CMIN looks the best candidate for future replacement of Si-based transistors. On the other hand, Si wafer can be used as a substrate for CMIN fabrication, and therefore Si-based and CNT-based devices can merge into integrated hybrid ICs.

2. Design and Fabrication of Nanotube Array Bipolar Transistor (NABT) Devices

The present invention also describes nanotube array bipolar transistors (NABT). In some embodiments, such a devices can be prepared by a providing at least one array of vertically nanotubes, sequentially depositing dielectric and metal layers, combined with processing for controllable formation of p- and n-type regions along the nanotube length so as to make p-n-p or n-p-n transistor structures. The NABT structure contains the nanotubes, in which the conductivity within a short distance in the middle of the nanotube is converted into the opposite type to form a transistor base.

Various embodiments provide for Nanotube Array Bipolar Transistors; others provide methods for making the same. One such embodiment of a Nanotube Array Bipolar Transistor comprises: (a) a first metal layer, optionally superposed on a substrate; (b) at least one array of at least one nanotube superposed on, positioned normal to the plane of, and in electrical communication with the first metal layer, wherein the at least one nanotube comprises sequential first, second, and third sections exhibiting a first, second, and first semiconductor-type conductivity, respectively, so as to have p-n-p or n-p-n semiconductor junctions; (c) a first dielectric layer superposed on the first metal layer having a thickness corresponding to the length of the first section of the at least one nanotube exhibiting the first semiconductor-type conductivity; (d) an optional second dielectric layer superposed on the first dielectric layer; (e) a second metal layer superposed on the optional second dielectric layer (in either case, superposed on the first dielectric layer); (f) an optional third dielectric layer superposed on the second metal layer, such that the combined thickness of the optional second dielectric, second metal, and optional third dielectric layers corresponds to the length of the second section of the at least one nanotube exhibiting the second semiconductor-type conductivity, and such that the second metal layer is in electrical communication with the section of the at least one nanotube exhibiting the second semiconductor-type conductivity; (g) a fourth dielectric layer superposed on the optional third dielectric layer (in either case, superposed on the second metal layer) having a thickness corresponding to the length of the third section of the at least one nanotube exhibiting the first semiconductor-type conductivity; and (h) a third metal layer, superposed on the fourth dielectric layer, in electrical communication with the at least one nanotube.

Embodiments comprising those devices wherein the second and third dielectric layers are present are preferred.

In various embodiments, the first and third nanotube sections exhibit p-type conductivity, the second nanotube section exhibits n-type conductivity, and the semiconductor junctions are p-n-p type In other embodiments, the first and third nanotube sections exhibit n-type conductivity, the second nanotube section exhibits p-type conductivity, and the semiconductor junctions are n-p-n type. These junctions are centered along the length of the total length of the nanotube within the at least one array of at least one nanotube.

As with all of the devices described herein, the nanotubes employed in these NABT devices must be capable of exhibiting semiconductor-type behavior. These may include metalloid or inorganic semiconductive nanotubes or carbon nanotubes, especially single-walled carbon nanotube. These vertical SWCNTs, in particular, can be prepared using methods, including those described above.

The metals used in these devices are those traditionally used in semiconductor processing, as described above. In this particular case, however, palladium is especially preferred for its low contact resistance.

Another feature of the use of SWCNTs in such devices is the ability to allow for ballistic movement along either the second portion (base) of the device or the entire length of the nanotube, such that either or both of these lengths are less than the nanotube ballistic mean free path, and various embodiments of this invention provide for this capability. This typically requires the entire nanotube to have a length of less than about 1 micron. Accordingly, in various separate embodiments, the entire length of the nanotubes in this device may be in the range independently having a lower boundary of about 1 nm, about 10 nm, about 50 nm, about 100 nm, or about 250 nm and an upper boundary of about 1000 nm, about 750 nm, about 500 nm, about 250 nm, about 100 nm, or about 50 nm. Exemplary examples of such ranges are those between about 1 nm and about 1000 nm (i.e., to about 1 micron), between about 100 nm and about 900 nm, between about 250 nm and about 750 nm, and between about 500 nm and about 750 nm. Similarly, additional embodiments comprise those devices wherein the length of the second portion of the nanotube (the base) is in the range independently having a lower boundary of about 1 nm, about 10 nm, about 50 nm, about 100 nm, or about 250 nm and an upper boundary of about 1000 nm, about 750 nm, about 500 nm, about 250 nm, about 100 nm, or about 50 nm. Exemplary examples of such ranges are those between about 1 nm and about 1000 nm (i.e., to about 1 micron), between about 100 nm and about 900 nm, between about 250 nm and about 750 nm, and between about 500 nm and about 750 nm.

Especially preferred embodiments include where both of these occur—i.e., where both the second portion (the base) and entire length at less than about 1 micron—though certain embodiments exist where they do not: i.e., where the length of the second portion (base) satisfies this less than 1 micron criterion but the total length of the entire nanotube exceeds that length.

Other embodiments provide for the fabrication of Nanotube Array Bipolar Transistors, using techniques elsewhere herein described. In one such embodiment, the fabrication steps comprise (a) growing at least one array of at least one nanotube normal to and in electrical communication with a first metal layer, such that the at least one nanotube exhibits a first type of semiconductor conductivity; (b) depositing a first dielectric layer, superposed on the first metal layer, encasing a first portion of the nanotube in the first dielectric layer and leaving a second portion of the at least one nanotube extending above the depth of the first dielectric layer; (c) converting the second portion of the at least one nanotube to the opposite type of semiconductor conductivity of the first portion of the at least one nanotube; (d) sequentially depositing an optional second dielectric layer, a second metal layer, an optional third dielectric layer, and a fourth dielectric layer, such that the combined optional thicknesses of the second dielectric layer, the second metal layer, and the optional third dielectric layer define a second length of the at least one nanotube, so as to leave a third portion of the at least one nanotube extending above the depth of the optional third dielectric layer, and such that the second metal layer is in electrical communication with the section of the at least one nanotube exhibiting the second type of semi-conductor conductivity; (e) converting the third portion of the at least one nanotube to the first type of semiconductor conductivity; (f) depositing a fourth dielectric layer, superposed on the optional third dielectric layer, to a depth covering the walls of the third section of the at least one nanotube; and (g) depositing a third metal layer, superposed on the fourth dielectric layer, so as to be in electrical communication with the at least one nanotube.

In some other embodiments, these methods are used to prepare the NABT devices, having one or more of the features described above.

In other embodiments, these methods use methods for growing single-walled carbon nanotubes also as described herein. In particular, such embodiments include those where small pads of catalytic materials are made and used, upon which to grow vertical SWCNTs. Additionally, still other embodiments provide for additional intermediary steps involving the removal any deposited dielectric from the sidewalls of the second or third portion of the nanotubes before converting the semiconductor conductivity type of these portions, for example, using techniques including reactive ion- or wet-etching. In certain circumstances, after the deposition of the fourth dielectric layer, some or all of the nanotubes protrude from the surface of this layer. Such an occurrence may be by accident or design. In fact, it may be deemed advantageous to leave such protuberances after the deposition of the fourth dielectric layer to as to provide for improved electrical connectivity between the third metal layer and the nanotube. In such cases, it is useful to polish the surface of the fourth dielectric layer, using techniques standard in the art (e.g., CMP techniques), so as to remove any incidental dielectric, exposing clean nanotube surfaces, and providing for excellent electrical communication between the nanotube and the third metal layer.

Figure 6:
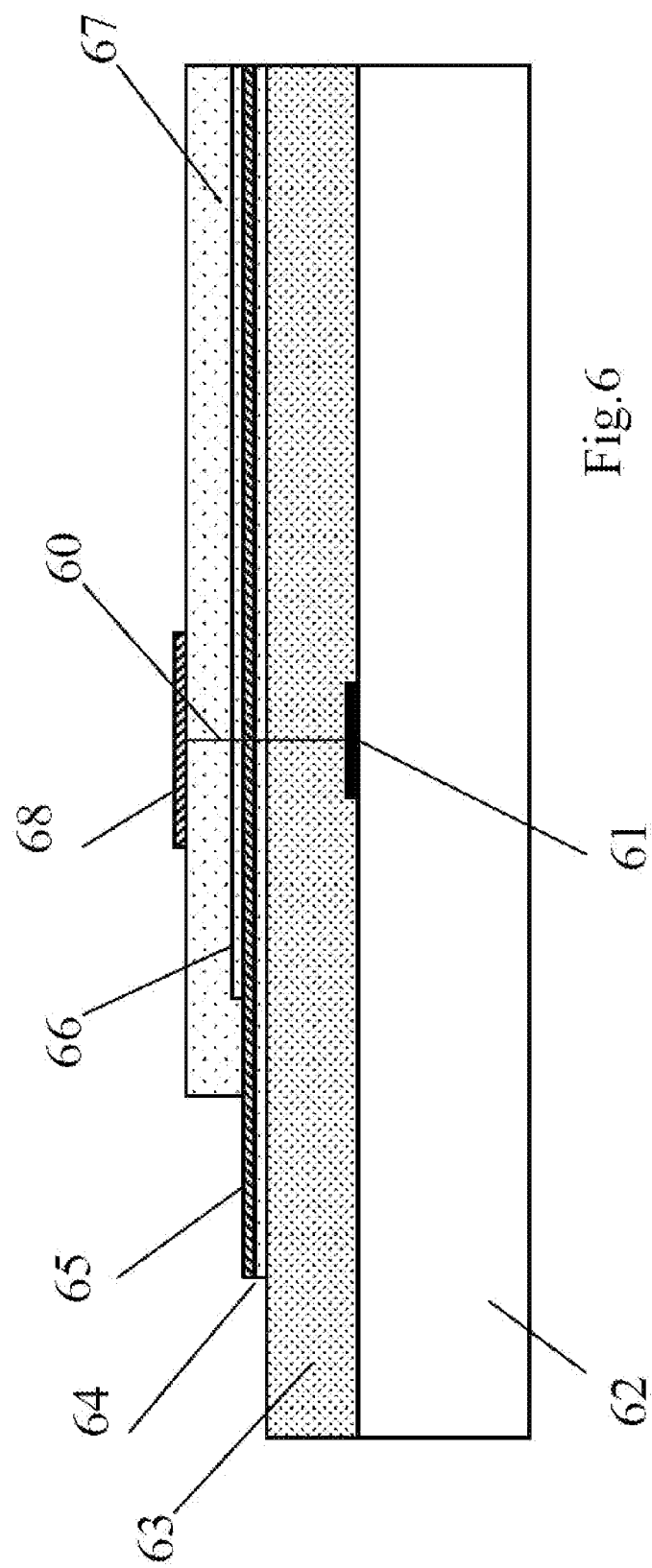
FIG. 6. Cross-sectional view of one embodiment of an NABT structure.
Figure 7:
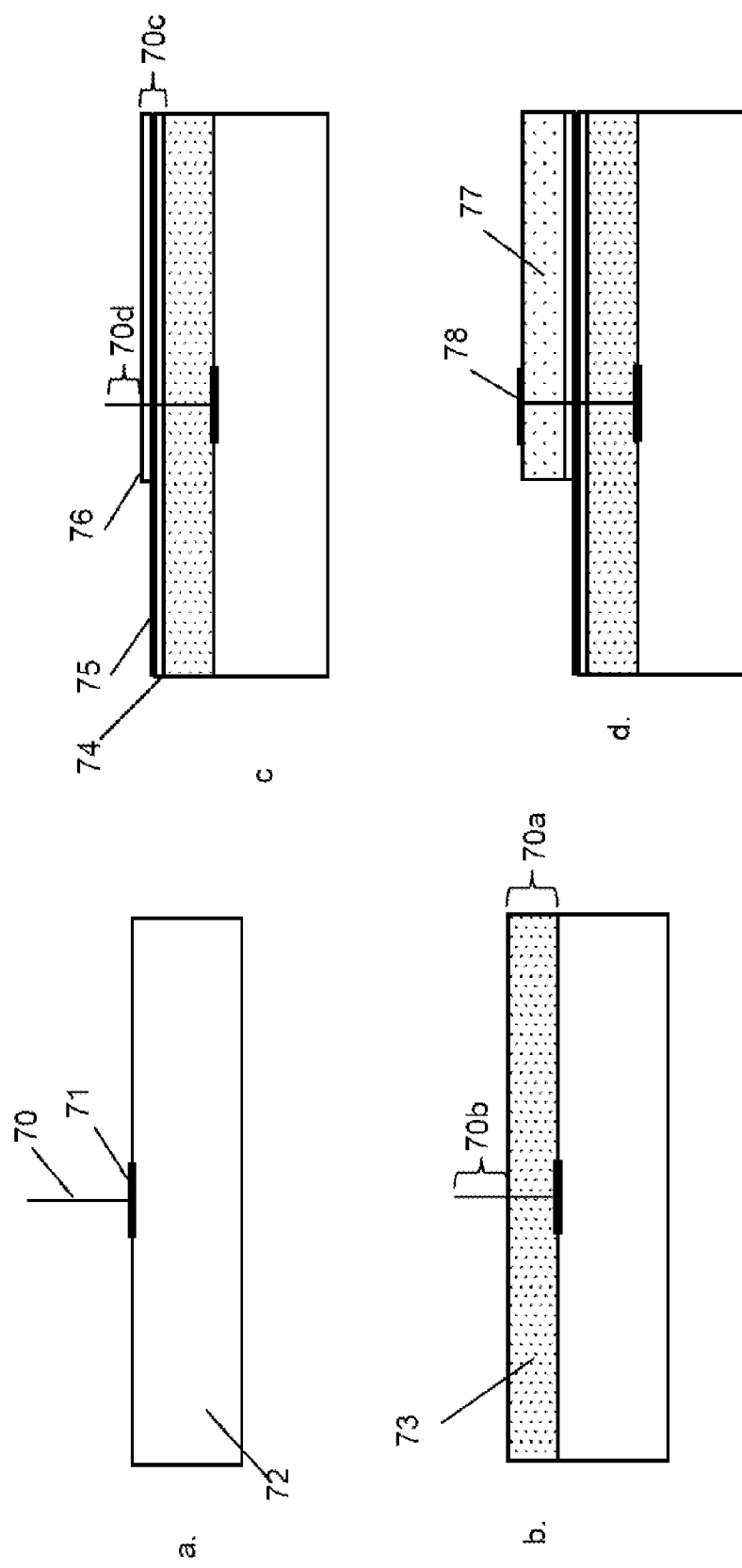
FIG. 7. One exemplary schematic of the processing steps for fabrication of an NABT FIG. 8. Cross-sectional and overhead views of one embodiment of an NALED structure.

The overall construction methods described are particularly suitable for mass fabrication of SWCNT-based bipolar transistors These techniques and features are further exemplified in the context of figures. FIG. 6 illustrates an exemplary NABT structure and FIG. 7 illustrates an exemplary fabrication scenario. Referring to FIG. 7, one method of fabrication starts from deposition of the emitter contact 71 on a substrate 72, on which the nanotube array 70, most preferably an array of SWCNTs, is grown. FIG. 7a. This is followed by deposition of four dielectric layers, 73, 74, 76 and 77 and the metal layer 75 which is sandwiched between two thin dielectric films 74 and 76. Note that elements 70-78 of FIG. 7 correspond to the elements 60-68 of FIG. 6, respectively.

The substrate may comprise any material capable of sustaining temperature of the nanotube growth (typically up to 600° C.). It is important to provide a low resistive contact to the emitter, and Pd is a preferred material for the electrode 71. Prior to the nanotube growth, an array of small pads of catalytic metal (not shown) may be deposited on the emitter electrodes to facilitate the nanotube growth.

Returning to the sequential deposition of the dielectric and metal layers, FIG. 7b, a dielectric layer 73 is deposited, in this case so as to cover approximately half of the nanotube length, 70a, forming the transistor base, and the exposed portion of the nanotube 70b is subjected to the conversion treatment to convert this portion into the opposite conductivity type. For example, if the p-n-p NABT is considered, after completion of the layer 73, the nanotubes may be cleaned to remove any thin layer of insulator from the nanotube sidewalls resulting from the deposition of the first dielectric layer and annealed in vacuum to convert uncovered portion of the nanotubes 70b into n-type material.

A thin dielectric layer 74 is next deposited, see FIG. 7c, to ensure that the positioning of the following metal layer 75 is completely within the n-type region. The metal layer serves as a contact to the base. Again, the Pd is preferable metal for this electrode. After deposition of the protective dielectric film 76, see FIG. 7c, which serves the same purpose as layer 74. The materials of layer 74 and 76 may be the same or different as each other or as with respect to layers 73 and 77. Again, the dielectric layers 74 and 76 are intended to ensure that the metal 75 contacts only the region of converted semiconductor type; in this case, the region of n-type conductivity. After deposition of layer 76, the remaining exposed nanotube portion 70d is cleaned and annealed again, this time in an oxidizing environment such as the air, to return the uncovered nanotubes back to p-type. (In certain less preferred embodiments, one or both of layers 74 or 76 are omitted). Hence, in this example, the length of the n-type region (base "thickness") is controlled by the total thickness of the layers 74, 75 and 76 (i.e., 70c). After deposition of the final dielectric layer 77, FIG. 7d, the top surface is polished to expose the nanotube ends, and then the deposition of the metal layer 78 ("collector") completes the processing.

Similar processing steps can be done for the n-p-n type device configuration. For example, in such a case, starting from the n-type SWCNTs at the emitter, the base region can be converted into p-type by annealing the SWCNTs in the air, and the collector part of the SWCNTs is converted back to n-type by annealing in vacuum.

The NABT is expected to possess superior properties than classical Si bipolar transistor. First, the base length determined by the thickness of the three layers 74, 75 and 76 can be made very short, e.g., ~20-30 nm. This length is sufficiently short to expect a ballistic carrier movement along the nanotube or at least within a part of it, see, e.g., A. Javey et al. Nano Letters, V. 4, p. 1319, 2004, or M. S. Fuhrer, et al. Electronic Properties of Molecular Nanostructures, ed. by H. Kuzmany, et al. p. 401, 2001, where the ballistic length was estimated to be ~0.7 μm. This implies much higher carrier speed than that in a classical semiconductor transistor base. For the base-collector voltage of ~1V, one can expect the ballistic carrier movement along both the base and the collector with the velocity close to $10^8$ cm/s, order of magnitude higher than the saturated electron velocity in Si. In addition, due to miniature nanotube diameter (~1-2 nm for SWCNT) the intrinsic transistor capacitances are minimized while the current density is exceedingly high, reaching $10^9$ A/cm$^2$ in SWCNTs. Further, there is no potential drop across the nanotube diameter, which precludes any effects of "current crowding", when the transistor efficiency in the center of the device decreases due to a lateral potential drop across the base, see. e.g. S. Sze, Physics of Semiconductor Devices, J. Wiley & Sons, NY, 1969.

Finally, a single nanotube in the array can be utilized as a bipolar transistor with a reasonable current value of ~10-20 μA. On the other hand, multiple nanotubes in the array connected in parallel can be used to compose a powerful transistor. If the collector pads are electrically separated from each other, then preliminary selection of the nanotubes before bunching them into a single high power device (to eliminate poor quality or metallic nanotubes) is possible, thereby improving the device performance.

3. Opto-Electronic Devices—General Features

The simple methods of variation of the carrier type of conductivity along the grown nanotube described herein also allows for the fabrication of p-n diode arrays. Devices based on this technology are expected to possess an extremely low intrinsic capacitance due to small nanotube diameter (1-2 nm for SWCNTs) and therefore, very high operational frequency.

Various embodiments of the present invention also include those which comprise semiconducting nanotubes adapted for opto-electronic applications. In such devices, injected electrons optically recombine with the holes and thus produce the light emission, i.e. a bipolar injection and interband recombination are the mechanisms for the light emission. Electron-hole injection in the forward bias direction will produce an interband photon emission. Two-dimensional quantization of electron and hole energy in the nanotube (i.e. "quantum wire" effect), with the density of states peaking at the quantum levels, ensures a high light emission efficiency, see E. Kapon, Proc. IEEE, 80, p. 398, 1992 and Book on Quantum Well Lasers, Ed. by P. S. Zory, 1993, p. 461. In addition, the nanotubes are calculated to have oscillator strength orders of magnitude larger than that in conventional direct gap semiconductors, see V. Perebeinos et al, Phys. Rev. Lett. 94, 086802, 2005. These features suggest a high optical efficiency in the Nanotube Array Light Emitting Diodes (NALED) and Nanotube Array Injection Laser (NAIL).

The disclosed nanotube array LEDs and Lasers are expected to possess unique performance characteristics due to such nanotube properties as direct optical transitions, which provide a high optical radiation probability, strong quantization of the energy spectrum yielding ballistic electron and hole propagation along the nanotube and resulting in suppression of any carrier trapping and non-radiative recombination. In addition, an ultra small nanotube dimension, much smaller than the light wavelength, allow light escape from the nanotubes into the dielectric without any internal reflections, in contrast with a conventional LED where due to internal light reflections typically only ~5% of light is released, see e.g. R. H. Saul et al, LED Device Design, Semiconductors and Semimetals, v. 22, p. 193, Part C, 1985. To completely eliminate the internal reflections at the dielectric/vacuum interface a selective etching of the dielectric is proposed and disclosed below.

In the NALED, having the light reflecting bottom metal layer (see below) almost 100% of light output will be redirected to be emitted upward. In addition, other factors adversely affecting the light power in the semiconductor LED, such as interfacial non-radiative recombination or self-absorption in the heterostructure, do not exist in the NALED. Finally, the fabrication technology for NALED is much simpler than that for a classical LED, where a multilayer lattice matched semiconductor heterostructure must be epitaxially grown and then carefully processed.

Even a single nanotube can be used as a light emitter. For a sustainable current of ~$10^{-5}$ A (equivalent to the current density of ~$10^9$ A/cm$^2$ in a single walled nanotube), the applied voltage of ~1V and a conservatively chosen light efficiency of 10%, one obtains the output light power of ~1 μW from a single nanotube. For the matrix of 100×100 nanotubes, 1 μm apart, for the photon energy of ~1 eV, it translates into a light power of 10 mW and the light power density of 100 W/cm$^2$, unachievable for the existing LEDs.

4. Design and Fabrication of Nanotube Array Light Emitting Diodes (NALED)

Various embodiments provide for Nanotube Array Light Emitting Diodes and methods of making the same. In one such embodiment, the Nanotube Array Light Emitting Diode comprises (a) a first electrically conductive layer capable of reflection at least 70% of incident light; (b) at least one array of a plurality of nanotubes superposed on, positioned normal to the plane of, and in electrical communication with the first electrically conductive layer, wherein each nanotube of the plurality of nanotubes comprises sequential first and second sections exhibiting opposite first and second semiconductor-type conductivity, respectively, so as to comprise a p-n or n-p semiconductor junction; (c) a first optically transparent or semi-transparent dielectric layer superposed on the first electrically conductive layer having a thickness corresponding to the length of the section of each nanotube exhibiting the first semiconductor-type conductivity; (d) a second optically transparent or semi-transparent dielectric layer superposed on the second dielectric layer having a thickness corresponding to the length of the section of each nanotube exhibiting the second semiconductor-type conductivity; and (e) a second electrically conductive layer superposed on the second dielectric layer and in electrical communication with the at least one array of nanotubes.

The first electrically conductive layer must be capable of reflecting at least 70% of incident light, though higher levels are preferred. For example, materials capable of reflecting at least 80%, at least 90%, at least 95%, or at least 99% of incident light are increasingly preferred embodiments. Metals, especially polished metals are exemplary materials, with those comprising aluminum being most preferred. Small pads of additional metal may be deposited on the first electrically conductive layer to minimize the contact resistance to the nanotubes.

As with all of the devices described herein, the presence of a semiconductor junction, in this case a p-n or n-p junction is a required element. Accordingly, those materials which can function in this capacity according to the descriptions herein are preferred embodiments with these devices as well. Devices wherein the nanotubes are SWCNTs are especially preferred embodiments.

Again, devices wherein the p-n or n-p junction is centered approximately in the middle of the nanotubes are described, the invention is not limited to such a precise definition of "middle," and the previous discussions related to the definition of the term "middle" apply here.

It should be appreciated that for a light emitting device to provide its benefit, the device must allow the light generated at the junction to escape. In the present design, the light passes through the "upper" second dielectric layer. Accordingly, this layer must be comprised of materials capable of transmitting light at the frequencies of interest. Similarly, the purpose of the optically reflective first electrically conductive layer is to reflect the light otherwise directed to the base direction out the "top" of the device. Similarly, then, the first dielectric layer must also be transparent or semi-transparent (translucent) to light. In this regard, the terms "transparent or semi-transparent (translucent) to light" refer to the ability to transmit at least 50% of the incident light, with preferred embodiments providing that at least 60%, at least 70%, at least 80%, at least 90%, at least 95% or at least 98% of light be transmitted. Materials capable of providing these levels of transmission may be organic or inorganic glasses or ceramics, for example silicon oxide-based glasses, silicon nitride, or transparent polymers, including polyimide. Taking this concept further, the device may also be constructed so that originally present dielectrics are removed and replaced with nascent air or other gas, or the device evacuated, such that the nanotubes are surrounded by gas or full or partial vacuum. In this way, the active area of the nanotube array is not subject to internal optical reflection and thus the photon output efficiency is maximized.

The second electrically conductive layer, together with small pads of metal having low contact resistance to the nanotubes (see below) provides the electrode complementing the first conductive layer. While it is necessary to make electrical connection to the other end of the nanotube, it must be present in such a ways as to maximize the passage of the transmitted light. Two strategies are useful for this purpose.

The first strategy provides that the second electrical conductive layer comprises traditional electrically conductive material (e.g., metals) formed as narrow strips, wires, ribbons, or meshes across the surface of the third dielectric layer, the widths of which are designed to provide minimal optical blocking, yet appropriate electrical carrying capacity. In various embodiments, small pads of metal (for example, palladium) may be deposited on the tips of the nanotubes contacting the third dielectric layer and providing electrical communication between the nanotubes and the second conductive layer. The typical metals described as traditionally employed in semiconductor processing may be used in this capacity.

A second, more preferred strategy, is to use optically transparent or semitransparent materials as the second conductive layer, configured either as the narrow strips, wires, ribbons, or meshes just discussed or as complete layers. Various materials are known as usefully employed in this way, including certain electrically conductive polymers, transparent ceramic oxides, or sufficiently thin metals. Exemplary electrically conductive polymers include polyfluorenes, polypyrenes, polyazulenes, polynaphthalenes, polypyrroles, polycarbazoles, polyindoles, polyazepines, polyanalines, polythiophenes, polyphenylene sulfides, polyacetylenes, or poly (p-phenylene vinylene)s. Exemplary transparent ceramic oxide include compositions comprising oxides of cadmium, indium, tin, and/or zinc, including those comprising tin oxide, indium tin oxide, indium zinc oxide, or aluminium doped zinc oxide. Indium tin oxide is a preferred material. Transparent metals, exemplified by gold, silver, or aluminum, may also be used, but are less preferred because of their reflectivity, and care must be taken to avoid reflectivity from the internal surfaces. For example, gold having a thickness of about 10 nm or less, or characterized as exhibiting a resistivity of 10, 15, or 20 ohm/cm$^2$ can be deposited either by chemical or vapor deposition, or laminated from commercial sources to as to provide sufficient light transmission and conductivity for the present purpose.

In some other embodiments, these methods are used to prepare the NALED devices, having one or more of the features described above.

In other embodiments, these methods use methods for growing nanotubes also as described herein. In particular, such embodiments include those where small pads of catalytic materials are made and used, upon which to grow vertical SWCNTs. Additionally, still other embodiments provide for additional intermediary steps involving the removal any deposited dielectric from the side-walls of the first or second portion of the nanotubes before converting the semiconductor conductivity type of these portions. In certain circumstances, after the deposition of the second dielectric layer, some or all of the nanotubes protrude from the surface of this layer. As when constructing NABT devices, such an occurrence may be by accident or design. In fact, it may be deemed advantageous to leave such protuberances after the deposition of the second dielectric layer to as to provide for improved electrical connectivity with the second conductive layer or metal pad. In such cases, it is useful to polish the surface of the fifth dielectric layer, using techniques standard in the art (e.g., CMP techniques), so as to remove any incidental dielectric, exposing clean nanotube surfaces, and providing for excellent electrical communication between the nanotube and the second conductive layer.

Other embodiments within the scope of the present invention include those electronic or optoelectronic devices where any of the Nanotube Array Light Emitting Diodes described herein is incorporated. Particularly useful embodiments include those where the Nanotube Array Light Emitting Diode is incorporated into an opaque display, a transparent window, or a reflective mirror (e.g., a computer monitor, television screen, or other device useful for communicating information).

Figure 8:
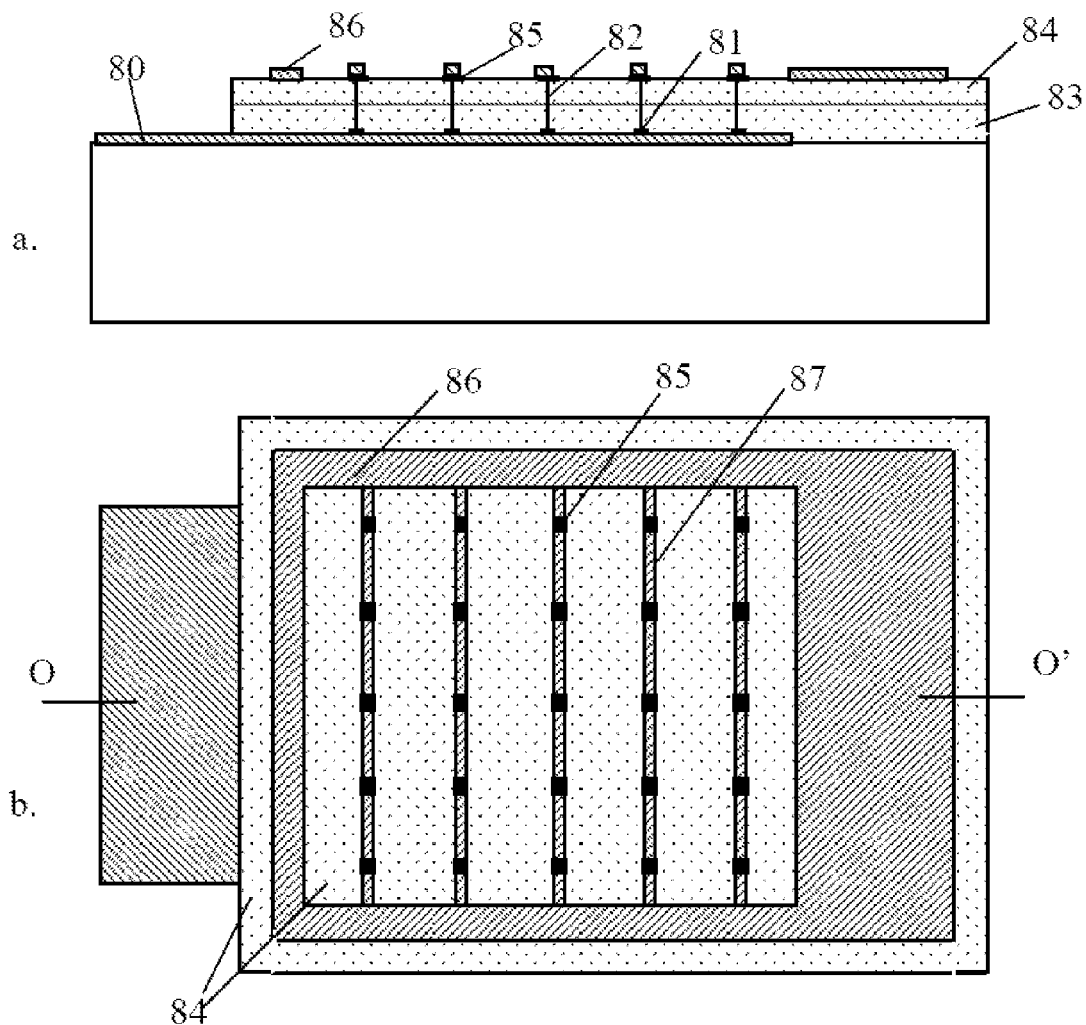

FIG. 8 shows one embodiment of a NALED structure (the description of materials within this exemplary embodiment should not be considered limiting, rather representative of the materials described above). In this embodiment, the fabrication scenario starts from deposition of the metal electrode 80, such as aluminum, having the high optical reflectivity described above, followed by deposition of pads of metal 81, for example Pd, having low contact resistance to the nanotubes and then small pads of catalytic metal on top of Pd pads (not shown) to facilitate the nanotube growth. The nanotube matrix 82 is then grown in the predetermined pattern: this pattern can be a linear array or as a two-dimensional matrix array, as shown in FIG. 8b. A first dielectric layer 83 is deposited around the grown nanotube array, so as to encase the lower portion of the array. The thickness of the first dielectric layer 83 reaches approximately a half of the nanotube length. At this stage, the remaining exposed nanotube parts (i.e., those portions extending above the upper surface level of dielectric layer 83) are cleaned, and the change of the nanotube type of conductivity is made using the above discussed methods of p-to-n and n-to-p conversions, thus forming a p-n junction. The second dielectric layer 84 is then deposited. It is preferable to have the total dielectric thickness smaller than the nanotube length, so that the nanotube ends are protruded through the dielectrics and then removed with the dielectric polishing, thereby exposing the nanotube tips. This step is followed by deposition of contact metal pads 85. Pd is preferred as a contact material again here to minimize the contact resistance. The size of contact pads 85 should be minimized to prevent light blocking. In the NALED of FIG. 8, both the emitted light and reflected light from the bottom metal layer 80 are directed into the top hemisphere, thus making a surface emitting LED configuration. A high optical reflection of the bottom metal layer 80 almost doubles the light output.

An exemplary top view of the NALED in FIG. 8b, shows a matrix array of 5×5 nanotubes with the top Pd contacts 85 connected to the metal contact ring 86 through the metal belts 87. These belts should be made of a narrow width so as to minimize the blocking of the passing light.

In other embodiments, these belts can be removed so as to improve the diode light efficiency if the top contact to the nanotubes, or metal pads attached thereto, is made from optically transparent conductor, such as described above. In this example, ITO is used as an exemplary material for this purpose. See FIG. 9. In this case, both metal ring 86 and connecting belts 87 of FIG. 8 are replaced with top transparent and conducting layer of ITO 90 placed on top of the dielectric 84 (91) and pads 85 (92).

Figure 10:
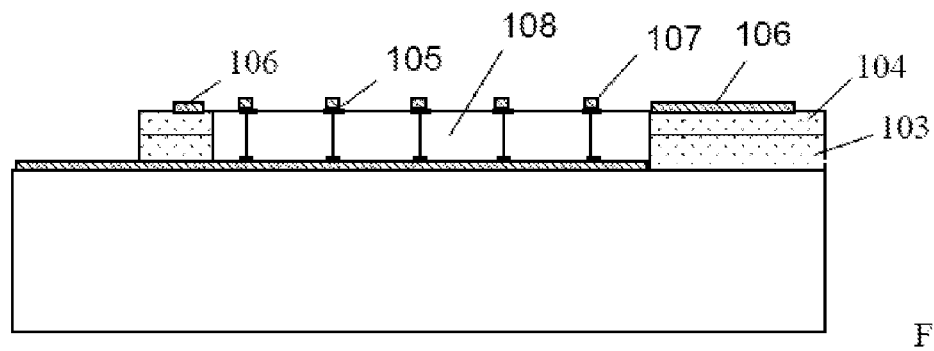
FIG. 10. Cross-sectional view of another embodiment of an NALED structure.

The important feature adversely affecting the photon collection in the semiconductor LED is the internal light reflection at the dielectric/ambient interface. In various embodiments, the additional operation of the dielectric etching to remove both layers of the dielectric (83 and 84 in FIG. 8) will completely eliminate the effect of internal reflection. FIG. 10 shows such an embodiment. Here, a NALED structure of the same nominal design as in FIG. 8 is shown, wherein two dielectric layers 103 and 104 (corresponding to 83 and 84 of FIG. 8) are etched in the active area of the device 108, so that the light can freely leave the diode structure. The contact belts 107 connecting the top metal contacts 105 to the contact ring 106 (corresponding to 87, 85, 86 of FIG. 8, respectively), are suspended in the air and attached to the contact ring 106 at the belt ends.

Figure 9:
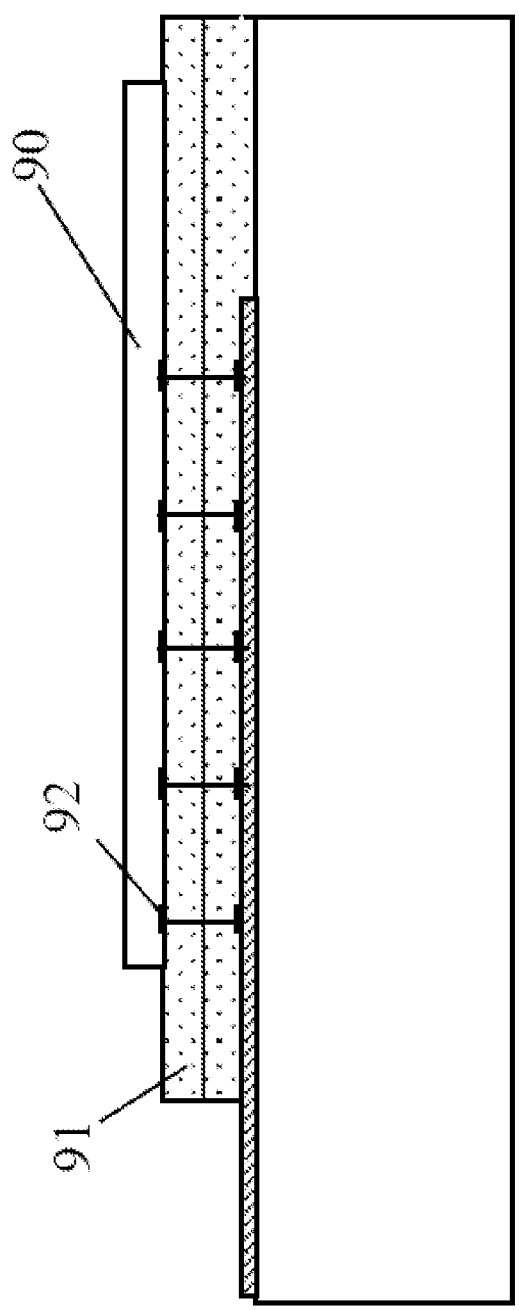
FIG. 9. Cross-sectional view of another embodiment of an NALED structure.
Figure 11:
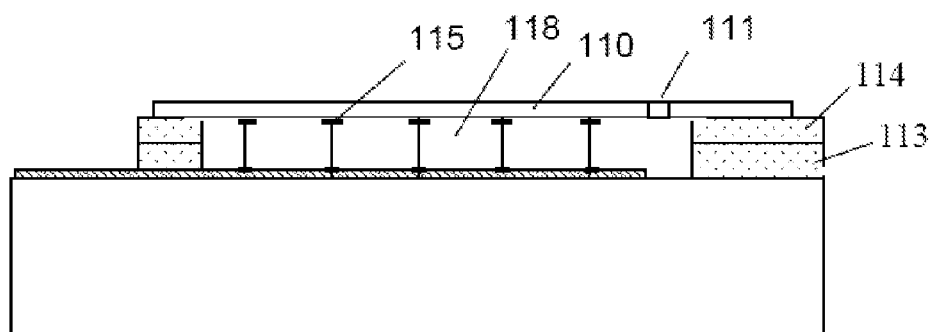
FIG. 11. Cross-sectional view of another embodiment of an NALED structure.

FIG. 11 shows another exemplary design, consistent with the designs shown in FIGS. 8-10) where the ITO layer 110 covers the active area 118 and the dielectric layers 113 and 114 are etched to eliminate internal reflections. Small openings 111 in the ITO layer 110 are introduced to facilitate the selective etching of the dielectrics 113 and 114.

It is important that the light radiating nanotubes are much smaller in size than the expected light wavelength, for reasons discussed above. In the NALED, having the light reflecting bottom metal layer 60, almost 100% of light output will be emitted upward. In addition, other factors adversely affecting the light power in the semiconductor LED, such as interfacial non-radiative recombination or self-absorption in the heterostructure, do not exist in the NALED. Finally, the fabrication technology for NALED is immeasurably simpler than that for a classical LED, where a multilayer lattice matched semiconductor heterostructure must be epitaxially grown and then carefully processed. Even a single nanotube can be used as a light emitter. For a sustainable current of $10^{-5}$ A (equivalent to the current density of $\sim 10^9$ A/cm$^2$ in a single walled nanotube), the applied voltage of $\sim 1$ V and a conservatively chosen light efficiency of 10%, one obtains the output light power of $\sim 1$ µW from a single nanotube. For the matrix of 100×100 nanotubes, 1 µm apart, it translates into a light power of 10 mW and the light power density of 100 W/cm$^2$, unachievable for the existing LEDs.

5. Design and Fabrication of Nanotube Array Injector Lasers (NAIL)

Excellent expected optical efficiency of the nanotubes also produces attractive conditions for the CNT quantum wire laser activity: peaking density of states at the quantum levels make the carrier population inversion quite plausible. In comparison with the existing semiconductor heterostructure quantum wire lasers, see aforementioned citations of E. Kapon, the CNT exhibits significantly more pronounced effect of quantization due to much smaller size of the quantum wire (nanotube diameter): ~100 nm for semiconductor case vs. ~1 nm for SWCNT. High calculated oscillator strength at the energy gap in the CNT, much higher than that in the semiconductors, would provide lower threshold for lasing. Finally, the NAIL technology is simple and far less expensive than that of the semiconductor-based quantum wire lasers.

Various embodiments provide for Nanotube Array Injector Lasers and methods of making the same. In one such embodiment, a Nanotube Array Injector Lasers comprises: (a) a first electrically conductive layer; (b) at least one array of a plurality of nanotubes superposed on, positioned normal to the plane of, and in electrical communication with the first electrically conductive layer, wherein each nanotube of the plurality of nanotubes comprises sequential first and second sections exhibiting opposite first and second semiconductor-type conductivity, respectively, so as to comprise a p-n or n-p semiconductor junction; (c) a first dielectric layer having a first refractive index superposed on the first electrically conductive layer; (d) a second dielectric layer having a second refractive index superposed on the first dielectric layer, such that the combined thickness of the first and second dielectric layers is about the same as the length of the first section of each nanotube, and wherein the second refractive index is greater than the first refractive index; (e) a third dielectric layer superposed on the second dielectric layer, and having the same thickness and being compositionally equivalent to the second dielectric layer; (f) a fourth dielectric layer superposed on the third dielectric layer, and having the same thickness and being compositionally equivalent to the first dielectric layer, such that the combined thickness of the third and fourth dielectric layers is about the same as the length of the second section of each nanotube, wherein the combined first and fourth dielectric layers define the first cladding of a laser waveguide and the combined second and third dielectric layers define the core of the laser waveguide; (g) a second electrically conductive layer superposed on the fourth dielectric layer and in electrical communication with the at least one array of nanotubes; and (h) two side mirrors positioned opposite to one another, normal to the planes of the first and second conductive layers, and parallel to the at least one nanotube array such that the at least one nanotube array is positioned between the two side mirrors, which are configured to create a Fabri-Perot resonator for the laser action.

Many of the embodiments of this type of device are similar to those described above for the NALED devices, including choices of materials, linear distance spacing, and/or configuration of the p-n or n-p junctions. For example, preferred embodiments of the Nanotube Array Injector Laser include those where the electrically conductive layers comprise palladium and where the nanotubes are single-walled carbon nanotubes.

In the case of the Nanotube Array Injection Lasers, the most preferred embodiments are those wherein the p-n or n-p junctions within a given array are positioned at the same linear distance relative to the other nanotubes in the same array, and that the thickness of the core and cladding layers are made or exist to match the frequencies of the light produced by these junctions. Exemplary thicknesses for each layer generally are in the range of between about 0.1 microns and about 10 microns, or between about 1 micron and about 5 microns The person of ordinary skill in the art of lasers would be well capable of defining these dimensions and appropriate materials of construction. Especially useful materials for these core and cladding layers are $SiO_2$ and $Si_3N_4$; i.e., wherein said first and fourth dielectric layers comprise $SiO_2$, while said second and third dielectric layers comprise $Si_3N_4$.

As derivative embodiments to this device type, the two side mirrors may be removed to produce a Light Emitting Diode. Similarly, other embodiments of this device type include those electronic devices which contain any of the embodiments of the Nanotube Array Injection Laser described herein.

Finally, the invention contemplates methods of making such Nanotube Array Injection Lasers, using the techniques as described herein that appropriate and applicable for the device as described.

Figure 12:
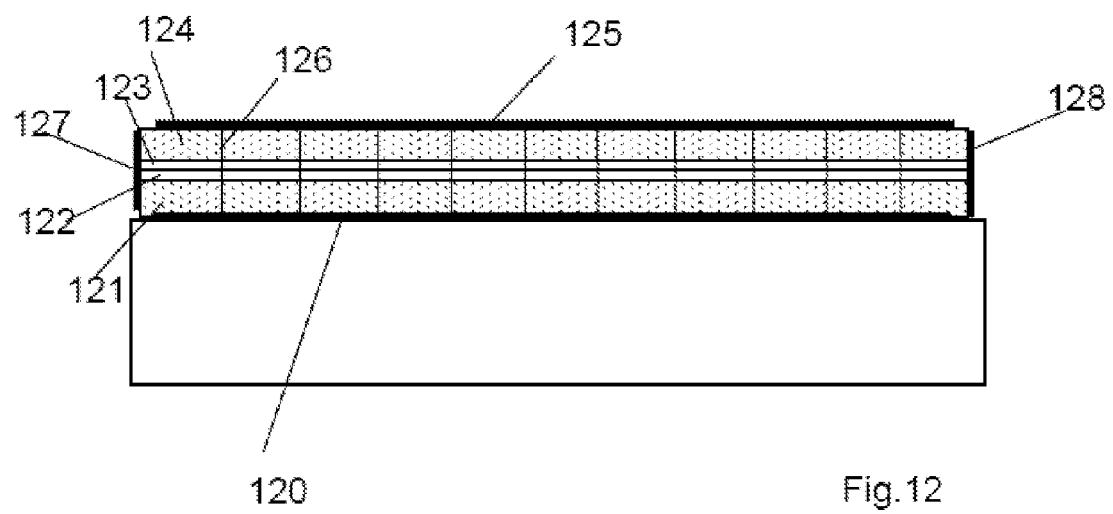
FIG. 12. Cross-sectional view of one embodiment of an NAIL structure.

FIG. 12. shows an exemplary NAIL structure. The nanotube matrix 76 is grown on the metal layer 120. It is preferable to use Pd layer to minimize the contact resistance. Then four dielectric layers 121, 121, 123 and 124 are sequentially deposited to form the core of the waveguide (122 and 123) and two cladding layers 123 and 124 for efficient light propagation parallel to the substrate plane. The thin practically identical layers 122 and 123 of the core have the index of refraction $n_{core}$ larger than that of the cladding layers 123 and 124, $n_{clad}$.

After deposition of the half of the waveguide, i.e. layers 121 and 122, the type of conductivity in the exposed nanotube array is altered by the earlier discussed methods to obtain a p-n junction along the nanotubes, with the change of conductivity occurring in the middle of the nanotube length. Then two other layers, 123 and 124, complete the waveguide structure. After polishing the top dielectric 124, to expose the nanotube ends, the top contact layer 125, preferably Pd, is deposited.

The optimal thickness D of the total core layer composed of the layers 122 and 123, depends on the difference of the refractive indices, $n_{core}-n_{clad}$, and the wavelength $\lambda$ (lambda). The fraction of the light intensity contained within the core, $\Gamma$ (gamma), is given by, see e.g. J. P. Leburton et al, J. Vac. Sci. Technol. B1, 415, 1983:

$$\Gamma=(2\pi^2 D2)/\lambda^2(n_{core}^2-n_{clad}^2)$$

Using the $Si_3N_4$ material for the core layers 122 and 123, with $n_{core}=2.5$, and $SiO_2$ material for the cladding layers 121 and 124, with $n_{clad}=1.46$, one obtains for $\lambda\sim 1$ micron and $\Gamma\sim 1$, $D\sim 200$ nm. The cladding layers 121 and 124, 2 μm each, make the total laser structure thickness of ~4.2 micron. Under these conditions, the laser wave strongly decays within cladding layers and practically does not interact with the contact layers 120 and 125. Two mirrors 127 and 128 at the ends of the laser bar are then deposited to make a Fabri-Perot resonator. It is also important that in the NAIL optical loss through free-carrier absorption is minimized since the interaction of the laser wave with conductive media occurs only at the nanotubes occupying extremely small device volume.

The NAIL structure without the mirrors 127 and 128 will operates as the LED with light propagation within the waveguide structure parallel to the substrate plane.

Thus, the disclosed technology unites together two different industries: electronics, normally relying on Si as a material for integrated circuits, and opto-electronics, typically employing III-V heterostructure materials. The proposed CNT-based devices and fabrication methods cover both these worlds: the new disclosed electronic and photonic devices can be combined on the same substrate, which can be a Si wafer or a piece of glass. The performance of these devices is expected to be greater than that of their semiconductor counterparts, largely due to excellent nanotubes properties, while the manufacturing cost is expected to be significantly lower.

Finally, it is important to emphasize that the nanotube arrays can be built on different dielectric materials, including the Si wafer. In the latter case, the Si electronic chips can be combined into hybrid optoelectronic circuits with fiber-optic signal output. Small disclosed nanotube array diodes can easily match optical fibers with extremely small losses at the interface.

As those skilled in the art will appreciate, numerous modifications and variations of the present invention are possible in light of these teachings, and all such are contemplated hereby. For example, in addition to the embodiments described herein, the present invention contemplates and claims those inventions resulting from the combination of features of the invention cited herein and those of the cited prior art references which complement the features of the present invention. Similarly, it will be appreciated that any described material, feature, or article may be used in combination with any other material, feature, or article.

The disclosures of each patent, patent application, and publication cited or described in this document are hereby incorporated herein by reference, in their entirety.

What is claimed:

1. A Nanotube Array Injection Laser comprising
    (a) a first electrically conductive layer;
    (b) at least one array of a plurality of nanotubes superposed on, positioned normal to the plane of, and in electrical communication with the first electrically conductive layer, wherein each nanotube of the plurality of nanotubes comprises sequential first and second sections exhibiting opposite first and second semiconductor-type conductivity, respectively, so as to comprise a p-n or n-p semiconductor junction;

(c) a first dielectric layer having a first refractive index superposed on the first electrically conductive layer;

(d) a second dielectric layer having a second refractive index superposed on the first dielectric layer, such that the combined thickness of the first and second dielectric layers is about the same as the length of the first section of each nanotube, and wherein the second refractive index is greater than the first refractive index (e) a third dielectric layer superposed on the second dielectric layer, and having the same thickness and being compositionally equivalent to the second dielectric layer;

(f) a fourth dielectric layer superposed on the third dielectric layer, and having the same thickness and being compositionally equivalent to the first dielectric layer, such that the combined thickness of the third and fourth dielectric layers is about the same as the length of the second section of each nanotube, wherein the combined first and fourth dielectric layers define the first cladding of a laser waveguide and the combined second and third dielectric layers define the core of the laser waveguide;

(g) a second electrically conductive layer superposed on the fourth dielectric layer and in electrical communication with the at least one array of nanotubes; and (h) two side mirrors positioned opposite to one another, normal to the planes of the first and second conductive layers, and parallel to the at least one nanotube array such that the at least one nanotube array is positioned between the two side mirrors, and configured to create a Fabri-Perot resonator for the laser action.

2. The Nanotube Array Injection Laser of claim 1, wherein said first and second electrically conductive layers comprise palladium.

3. The Nanotube Array Injection Laser of claim 1, wherein all four dielectric layers are optically transparent or semi-transparent.

4. The Nanotube Array Injection Laser of claim 1, wherein said first and fourth dielectric layers comprise $SiO_2$, while said second and third dielectric layers comprise $Si_3N_4$.

5. The Nanotube Array Injection Laser of claim 1, where the two side mirrors are removed to produce a Light Emitting Diode.

6. An electronic device comprising the Nanotube Array Injection Laser of claim 1.

7. The Nanotube Array Injection Laser of claim 1, wherein the nanotubes are carbon nanotubes.

8. The Nanotube Array Injection Laser of claim 7, wherein the carbon nanotubes are single walled carbon nanotubes.

9. The Nanotube Array Injection Laser of claim 1, wherein all four dielectric layers are optically transparent or semi-transparent;
    wherein said first and fourth dielectric layers comprise $SiO_2$, while said second and third dielectric layers comprise $Si_3N_4$; and
    wherein the nanotubes are single walled carbon nanotubes.

10. The Nanotube Array Injection Laser of claim 9, where the two side mirrors are removed to produce a Light Emitting Diode.

* * * * *